(12) United States Patent
Krause et al.

(10) Patent No.: US 12,025,681 B2
(45) Date of Patent: Jul. 2, 2024

(54) METHOD FOR DETERMINING A SENSITIVITY OF A HALL SENSOR ELEMENT, AND HALL SENSOR WITH AT LEAST ONE HALL SENSOR ELEMENT

(71) Applicant: Fraunhofer-Gesellschaft zur Foerderung der angewandten Forschung e.V., Munich (DE)

(72) Inventors: Dennis Krause, Erlangen (DE); Markus Stahl-Offergeld, Erlangen (DE); Christian Kohlbrenner, Erlangen (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 17/470,898

(22) Filed: Sep. 9, 2021

(65) Prior Publication Data

US 2022/0082640 A1    Mar. 17, 2022

(30) Foreign Application Priority Data

Sep. 11, 2020    (EP) ..................................... 20195837

(51) Int. Cl.
    *G01R 33/07* (2006.01)
(52) U.S. Cl.
    CPC .................... *G01R 33/07* (2013.01)
(58) Field of Classification Search
    CPC combination set(s) only.
    See application file for complete search history.

(56) References Cited

U.S. PATENT DOCUMENTS

| 6,630,882 | B1* | 10/2003 | Heremans | G01R 33/06 |
| | | | | 257/536 |
| 2003/0117208 | A1* | 6/2003 | Bicking | H03K 17/9517 |
| | | | | 327/513 |
| 2008/0265880 | A1* | 10/2008 | Nishikawa | G01R 33/07 |
| | | | | 324/251 |
| 2009/0108839 | A1* | 4/2009 | Ausserlechner | G01L 5/162 |
| | | | | 324/251 |

(Continued)

FOREIGN PATENT DOCUMENTS

| DE | 102010028390 B4 | 12/2012 |
| EP | 2490037 B1 | 2/2014 |

(Continued)

*Primary Examiner* — Alvaro E Fortich
(74) *Attorney, Agent, or Firm* — Perkins Cole LLP; Michael A. Glenn

(57) ABSTRACT

A method for determining a sensitivity of a Hall sensor element in consideration of an interdependency between the temperature dependence of the sensitivity and the temperature dependence of the operational quantity of the Hall sensor element includes: identifying a reference sensitivity and a reference value of the operational quantity of the Hall sensor element; determining an instantaneous value of the operational quantity of the Hall sensor element on the basis of a drive signal of the Hall sensor element; and determining the sensitivity of the Hall sensor element on the basis of the reference sensitivity, the reference value of the operational quantity, the identified instantaneous value of the operational quantity, and the interdependency.

29 Claims, 11 Drawing Sheets

(56) References Cited

U.S. PATENT DOCUMENTS

| | | | |
|---|---|---|---|
| 2012/0212216 A1 | 8/2012 | Stahl-Offergeld et al. | |
| 2013/0057256 A1 | 3/2013 | Ernst et al. | |
| 2016/0299199 A1 | 10/2016 | Cesaretti et al. | |
| 2016/0356862 A1* | 12/2016 | Ariyama | H03K 17/14 |
| 2018/0172779 A1* | 6/2018 | Stahl-Offergeld | G01R 33/075 |
| 2018/0172780 A1 | 6/2018 | Kaufmann et al. | |
| 2018/0292469 A1 | 10/2018 | Hohe et al. | |
| 2018/0372811 A1* | 12/2018 | Angelini | H03G 3/30 |

FOREIGN PATENT DOCUMENTS

| | | | | |
|---|---|---|---|---|
| EP | 2871488 A1 | 5/2015 | | |
| EP | 3341746 B1 | 8/2019 | | |
| EP | 3422032 B1 | 12/2019 | | |
| WO | WO-2005073744 A1 * | 8/2005 | | G01R 33/07 |

* cited by examiner

100

```
┌─────────────────────────────────────────────────────────┐
│ Detecting a reference sensitivity S₀ and a reference    │
│ value X₀ of the operational quantity X of the Hall      │─ 110
│ sensor element 20                                       │
└─────────────────────────────────────────────────────────┘

┌─────────────────────────────────────────────────────────┐
│ Determining an instantaneous value X₁ of                │
│ the operational quantity X of the Hall sensor element   │─ 120
│ on the basis of a control signal S_IN of the Hall       │
│ sensor element                                          │
└─────────────────────────────────────────────────────────┘

┌─────────────────────────────────────────────────────────┐
│ Determining the sensitivity S_Hall of the Hall sensor   │
│ element 20 on the basis of the reference sensitivity S₀,│
│ the reference value X₀ of the operational quantity X,   │─ 130
│ the instantaneous value X₁ of the operational quantity  │
│ X and the interdependency                               │
└─────────────────────────────────────────────────────────┘
```

Fig. 1 — Method flow diagram with steps:

- 110: Detecting a reference sensitivity $S_0$ and a reference value $X_0$ of the operational quantity $X$ of the Hall sensor element 20
- 120: Determining an instantaneous value $X_1$ of the operational quantity $X$ of the Hall sensor element on the basis of a control signal $S_{IN}$ of the Hall sensor element
- 130: Determining the sensitivity $S_{Hall}$ of the Hall sensor element 20 on the basis of the reference sensitivity $S_0$, the reference value $X_0$ of the operational quantity $X$, the instantaneous value $X_1$ of the operational quantity $X$ and the interdependency
- 140 (optional): Determining the sensitivity $S_{Hall}$ of the Hall sensor element 20 on the basis of the reference sensitivity $S_0$ and the ratio between the reference value $X_0$ of the operational quantity $X$ and the detected instantaneous value $X_1$ of the operational quantity $X$ of the Hall sensor element or

- 170 (optional): Determining 170 the sensitivity $S_{Hall}$ of the Hall sensor element 20 on the basis of the reference sensitivity $S_0$ and the quotient between the electric reference value $X_0$ of the operational quantity $X$ and the detected instantaneous value $X_1$ of the Hall sensor element and optional steps 150 and 160

┌─────────────────────────────────────────────────────────────┐
│ Providing a model F(X,T) for the sensitivity $S_{Hall}$ with │
│ the operational quantity X of the Hall sensor element 20    │
│ and with the temperature T as a variable,                   │ ~210
│ wherein the operational quantity X depends on the electric  │
│ resistance value $R_{Hall}$ of the sensor element           │
└─────────────────────────────────────────────────────────────┘

┌─────────────────────────────────────────────────────────────┐
│ Determining an instantaneous value X1 of the operational    │
│ quantity X of the Hall sensor element 20 on the basis of    │ ~220
│ a control signal $S_{IN}$ of the Hall sensor element        │
└─────────────────────────────────────────────────────────────┘

┌─────────────────────────────────────────────────────────────┐
│ Determining the instantaneous temperature $T_1$             │ ~230
│ of the Hall sensor element                                  │
└─────────────────────────────────────────────────────────────┘

┌─────────────────────────────────────────────────────────────┐
│ Determining the instantaneous sensitivity $S_{Hall}$ of the Hall │
│ sensor element 20 on the basis of the value of the model,   │
│ associated with the instantaneous temperature value $T_1$ and │ ~240
│ the instantaneous value $X_1$ of the operational quantity X │
└─────────────────────────────────────────────────────────────┘ optional:
wherein step 210 of providing further comprises:

┌─────────────────────────────────────────────────────────────┐
│ Detecting a sensitivity value $S_N$ of a value $X_N$        │
│ of the operational quantity X of the Hall sensor element 20 │ ~250
│ at a plurality of temperature values $T_N$ each             │
└─────────────────────────────────────────────────────────────┘

┌─────────────────────────────────────────────────────────────┐
│ Detecting the model F(X,T) for the sensitivity $S_{Hall}$   │
│ with the electric operational quantity X of the Hall sensor │ ~260
│ element 20 and the temperature T as a variable              │
└─────────────────────────────────────────────────────────────┘

Providing a model $f_{SXN}(T)$ for a sensitivity-operational quantity relationship of a sensitivity $S_{Hall}$ and an operational quantity X of the Hall sensor element 20 with the temperature T as a variable, wherein the operational quantity X depends on the electric resistance value $R_{Hall}$ of the sensor element 20 — 310

Determining an instantaneous value $X_1$ of the operational quantity X of the Hall sensor element 20 on the basis of a control signal $S_{IN}$ of the Hall sensor element — 320

Determining the instantaneous temperature $T_1$ of the Hall sensor element — 330

Determining the instantaneous sensitivity $S_{Hall}$ of the Hall sensor element 20 on the basis of the value for the sensitivity-operational quantity relationship, associated with the instantaneous temperature $T_1$, and the instantaneous value $X_1$ of the operational quantity X — 340 optional:
wherein step 310 of providing further comprises:

Detecting a sensitivity value $S_N$ and a value $X_N$ of the operational quantity X of the Hall sensor element 20 at a plurality of temperature values $T_N$ each — 350

Detecting the model $f_{SXN}(T)$ for the sensitivity-operational quantity relationship of a sensitivity $S_{Hall}$ and an electric operational quantity X of the Hall sensor element 20 with the temperature T as a variable — 360

Fig. 6

METHOD FOR DETERMINING A SENSITIVITY OF A HALL SENSOR ELEMENT, AND HALL SENSOR WITH AT LEAST ONE HALL SENSOR ELEMENT

CROSS-REFERENCES TO RELATED APPLICATIONS

This application claims priority from European Patent Application No. EP20195837.8, filed on Sep. 11, 2020, and from German Patent Application No. 10 2020 212 114.1, filed on Sep. 25, 2020, which are both incorporated herein in their entirety by reference.

BACKGROUND OF THE INVENTION

The present invention relates to a method for determining the (magnetic) sensitivity of a Hall sensor element, and to a Hall sensor with at least one Hall sensor element and a processing means for performing the method. In particular, the present invention relates to determining a resistance-normalized sensitivity of a Hall sensor comprising one or a plurality of Hall sensor elements, wherein, by linking a Hall sensor resistance and a Hall sensor sensitivity, the instantaneous sensitivity of the respective Hall sensor element may be measured or captured indirectly. This enables achieving sensitivity synchronism in Hall sensors with a plurality of Hall sensor elements, such as in a 2D or 3D Hall sensor. Furthermore, it enables indirect measurement of the sensitivity and Hall sensors in general, i.e. in absolute value-based measurement systems, such as current sensors.

The characteristic of Hall sensors, or individual Hall sensor elements, such as their magnetic sensitivity, depends on a number of factors and influencing variables that affect the magnetic field sensor. For example, during the production of magnetic field sensors, any process and manufacturing tolerances of the CMOS process (CMOS=complementary metal oxide semi-conductor) used with the resulting doping profiles, mask accuracies, and adjustment tolerances may affect the characteristics of the magnetic field sensors and therefore influence and define them. Furthermore, parameters in the later operation, such as the sensor temperature due to the ambient temperature, may also influence and define the characteristics of the magnetic field sensor, and particularly its sensitivity. Variations of the ambient temperature (within the sensor operation temperature range) may lead to variations of the sensor sensitivity of up to ±20%. In addition, in the special case of 2D and 3D Hall sensors, the temperature influence differently affects the sensitivity of the lateral and vertical sensors, wherein the difference in the sensitivity drift between a vertical sensor (e.g. a Z sensor) and a lateral sensor (e.g. a X/Y Hall sensor) may also be in the range of ±15%.

In the context of the present description, the individual magnetic field-sensitive sensor elements are referred to as Hall sensor elements, wherein the resulting sensor arrangement with at least one or even a plurality of individual Hall sensor elements and, e.g. with the associated control circuit and (optionally) the evaluation circuit is referred to as Hall sensor. The control circuit with the optional evaluation circuit is also referred to as to processing means (unit).

To determine the sensitivity of a Hall sensor, a magnetic field with a preferably known magnetic flux density is generated via a coil at the location of the Hall sensor element, or the Hall sensor elements, of the Hall sensor. The sensitivity of the Hall sensor element may then be gathered via the variation of the output signal of the respective Hall sensor element. In case of a magnetic field sensor based on Hall sensor elements, the sensitivity of the respective Hall sensor element may be gathered via a variation of the Hall voltage caused by a variation of the magnetic flux density in the sensor element.

So far, the sensitivity of individual Hall sensor elements or of Hall sensors with (vertical and/or horizontal) Hall sensor elements is measured in a routine test at different temperatures with external Helmholtz coil pairs and is stored for the later correction as retrievable values in an accessible memory. In this case, the number of required temperature points as well as the step sizes between these temperature points depend on the requested residual tolerance in the sensitivity of the Hall sensor elements. This sensitivity measurement and/or the calibration across the temperature with external Helmholtz coils makes such a routine test very time-consuming, which is why a routine test is expensive, elaborate and inflexible.

Coils located near the Hall sensor elements, e.g. which may be integrated on the Hall sensor chip or embedded into the circuit board for the Hall sensor elements, are a first approach to measure the sensitivity without external Helmholtz coil pairs. These integrated coils generate in the respective Hall sensor element a magnetic field defined in its flux density and frequency. In addition to simplifying the routine test setup, these arrangements enable measuring the sensor sensitivity in the application. However, if an external magnetic field of a similar frequency is superimposed, it cannot be distinguished from the internally generated magnetic field, and the sensitivity measurement performed is erroneous. Thus, such a calibration method with integrated coils works only in magnetically defined environments, or may be applied there, for example. Patent publications DE102010028390 B4, EP 2490037 B1 and EP 3341746 B1 describe integrated conductors or coils for determining a sensitivity in routine tests without Helmholtz coils.

Thus, there is a need for a concept to measure a sensitivity of Hall sensor elements that may be performed and implemented with as little effort as possible, i.e. preferably without external or integrated coils.

Based on the known technology indicated, the object underlying the invention is to provide an improved method for determining a sensitivity, i.e. the instantaneous sensitivity of a Hall sensor element or a Hall sensor with several Hall sensor elements, which may be performed as inexpensively, quickly and accurately as possible, and in particular, in the application (in situ).

SUMMARY

An embodiment may have a method for determining a sensitivity ($S_{Hall}$) of a Hall sensor element in consideration of an interdependency between the temperature dependence of the sensitivity ($S_{Hall}$) and the temperature dependence of an operational quantity (X) dependent on the electrical resistance value ($R_{Hall}=R_1$) of the Hall sensor element, having the steps of: identifying a reference sensitivity ($S_0$) and a reference value ($X_0$) of the operational quantity (X) of the Hall sensor element, determining an instantaneous value ($X_1$) of the operational quantity (X) of the Hall sensor element on the basis of a drive signal ($S_{IN}$) of the Hall sensor element, and determining the sensitivity ($S_{Hall}$) of the Hall sensor element on the basis of the reference sensitivity ($S_0$), the reference value ($X_0$) of the operational quantity (X), the instantaneous value ($X_1$) of the operational quantity (X), and the interdependency.

Another embodiment may have a method for determining a sensitivity of a Hall sensor, wherein the Hall sensor comprises a plurality of Hall sensor elements, having the step of: performing the method according to the invention for the plurality of Hall sensor elements for determining the respective sensitivity of the Hall sensor elements of the Hall sensor.

Another embodiment may have a Hall sensor, comprising: at least one Hall sensor element; and a processing unit configured for performing the inventive methods.

Another embodiment may have a method for determining a sensitivity ($S_{Hall}$) of a Hall sensor element, having the steps of: providing a model (F(X,T)) for the sensitivity ($S_{Hall}$) with the operational quantity (X) of the Hall sensor element and the temperature (T) as a variable, wherein the operational quantity (X) depends on the electrical resistance value ($R_{Hall}$) of the senor element, determining an instantaneous value ($X_1$) of the operational quantity (X) of the Hall sensor element on the basis of a drive signal ($S_{IN}$) of the Hall sensor element, determining the instantaneous temperature ($T_1$) of the Hall sensor element, and determining the instantaneous sensitivity ($S_{Hall}$) of the Hall sensor element on the basis of the value of the model that is associated with the instantaneous temperature value ($T_1$) and the instantaneous value ($X_1$) of the operational quantity (X).

Another embodiment may have a method for determining a sensitivity ($S_{Hall}$) of a Hall sensor element, having the steps of: providing a model ($f_{SXN}(T)$) for a sensitivity-operational quantity relationship of a sensitivity ($S_{Hall}$) and an operational quantity (X) of the Hall sensor element with the temperature (T) as a variable, wherein the operational quantity (X) depends on the electrical resistance value ($R_{Hall}$) of the sensor elements, determining an instantaneous value ($X_1$) of the operational quantity (X) of the Hall sensor element on the basis of a drive signal ($S_{IN}$) of the Hall sensor element, determining the instantaneous temperature ($T_1$) of the Hall sensor element, and determining the instantaneous sensitivity ($S_{Hall}$) of the Hall sensor element on the basis of the value for the sensitivity-operational quantity relationship that is associated with the current temperature value ($T_1$), and the instantaneous value ($X_1$) of the operational quantity (X).

Another embodiment may have a Hall sensor, comprising: a Hall sensor element: and a processing unit configured for performing the inventive methods.

According to an embodiment, a method for determining a sensitivity of a Hall sensor element in consideration of an interdependency between the temperature dependence of the sensitivity and the temperature dependence of an operational quantity (or operational value) dependent on the electrical resistance value of the Hall sensor element includes the following steps: identifying a reference sensitivity and a reference value of the operational quantity of the Hall sensor element, determining an instantaneous value of the operational quantity of the Hall sensor element on the basis of a drive signal of the Hall sensor element, and determining the sensitivity of the Hall sensor element on the basis of the reference sensitivity, the reference value of the operational quantity, the instantaneous value of the operational quantity, and the interdependency.

According to an embodiment, a Hall sensor includes at least one Hall sensor element; and a processing means configured for performing the method for determining a sensitivity of a Hall sensor element.

According to an embodiment, a method for determining a sensitivity of a Hall sensor element includes the following steps: providing a model F(X,T) for the sensitivity with the operational quantity of the Hall sensor element and the temperature as a variable, wherein the operational quantity depends on the electrical resistance value of the senor element, determining an instantaneous value of the operational quantity of the Hall sensor element on the basis of a drive signal of the Hall sensor element, determining the instantaneous temperature of the Hall sensor element, and determining the instantaneous sensitivity of the Hall sensor element on the basis of the value of the model that is associated with the instantaneous temperature value and the instantaneous value of the operational quantity.

According to an embodiment, a method for determining a sensitivity of a Hall sensor element includes the following steps: providing a model for a sensitivity-operational quantity relationship of a sensitivity and an operational quantity of the Hall sensor element with the temperature as a variable, wherein the operational quantity depends on or is derivable from the electrical resistance value of the sensor elements, determining an instantaneous value of the operational quantity of the Hall sensor element on the basis of a drive signal of the Hall sensor element, determining the instantaneous temperature of the Hall sensor element, and determining the instantaneous sensitivity of the Hall sensor element on the basis of the value for the sensitivity-operational quantity relationship that is associated with the current temperature value, and the instantaneous value of the operational quantity.

According to an embodiment, a Hall sensor includes (at least) one Hall sensor element; and a processing means configured for performing the method for determining a sensitivity of a Hall sensor element.

The core idea of the present invention is that a sensitivity measurement, or a calibration, of a Hall sensor element or a Hall sensor (with at least one Hall sensor element) may be performed effectively by employing a known (=e.g. identified or specified) interdependency between the temperature dependence of the sensitivity of the respective Hall sensor element and the temperature dependence of the electrical resistance, e.g. the internal resistance or Hall resistance, or an operational quantity (X) of the Hall sensor element dependent on or derived from the electrical resistance value ($R_{Hall}=R_1$) of the Hall sensor element (20).

For example, the operational quantity dependent on the electrical resistance value of the Hall sensor element (1.) may be the electrical resistance value of the Hall sensor element, or (2.) may further be the electrical conductivity value (or conductance) of the Hall sensor element, or (3.) may be, in the voltage-controlled operation (with a specified or constant supply voltage), the (resulting, applied (impressed)) supply current of the Hall sensor element, or (4.) may be, in the current-controlled operation (with a specified or contrast supply current), the (resulting, applied) supply voltage of the Hall sensor element, or (5.) may be, in the free-running operation, the electrical resistance value or the electrical conductivity value of the Hall sensor element (according to Ohm's law R=U/I) based on the supply current and the supply voltage of the Hall sensor element (in the operating point of the Hall sensor element).

Thus, the known interdependency between the temperature dependence of the sensitivity of the Hall sensor element and the temperature dependence of the resistance of the Hall sensor element is used to gather the instantaneous sensitivity of the Hall sensor element solely via identifying the operational quantity of the Hall sensor element dependent on or derived from the instantaneous electrical resistance value of the Hall sensor element, or the instantaneous resistance value of the Hall sensor element itself, wherein this quantity is identified by measuring or capturing the instantaneous drive signal (=the applied signal, e.g. the supply current or supply voltage) to the Hall sensor element. Furthermore, according to the respective operational mode, this operational quantity may also be identified by measuring, or capturing, the instantaneous drive signals (e.g. supply current and supply voltage) to the Hall sensor element so as to be able to gather the instantaneous sensitivity of the Hall sensor element.

Thus, the sensitivity measurement, or calibration, of a Hall sensor element, with the knowledge of the interdependency between the temperature dependence of the sensitivity of the Hall sensor element and the temperature dependence of the resistance of the Hall sensor element (essentially) or the operational size dependent thereon, may be done solely by identifying the instantaneous electrical resistance value or the operational quantity (X) of the Hall sensor element dependent on or derived from the instantaneous electrical resistance value ($R_{Hall}=R_1$) of the Hall sensor element (20).

Thus, the present concept is characterized by the fact that the (instantaneous) temperature-dependent sensitivity of a Hall sensor element is observable, or reproducible, in its temperature-dependent resistance, and is therefore "directly" or "indirectly" measurable, or derivable, via the electrical resistance. Thus, the basis of the present concept is the link, or interdependency, of the sensitivity of the Hall sensor with its electrical resistance value and their temperature dependences.

That is, the relationship or the ratio between the temperature-dependent sensitivity of a Hall sensor element and its temperature-dependent electrical resistance or the operational quantity of the Hall sensor element dependent on or derived from the instantaneous electrical resistance value of the Hall sensor element is regarded as the interdependency.

According to an embodiment, the present concept refers to a known, identified or specified interdependency, i.e. a defined relation between the temperature dependence of the (magnetic) sensitivity and the temperature dependence of the operational quantity of the Hall sensor element, wherein the sensitivity of the Hall element and the operational quantity of the Hall element vary across the temperature, and wherein the temperature-related variation of the sensitivity and the temperature-related variation (change) of the operational quantity of the Hall element are in a known relationship with each other. This interdependency, or this specified relationship, is now employed to gather via the variation of the operational quantity of the Hall element, i.e. via the comparison of the instantaneous value of the operational quantity of the Hall sensor element with a reference value of the operational quantity of the Hall sensor element, the instantaneous sensitivity of the Hall sensor element, i.e. the variation compared to the reference sensitivity value of the Hall sensor element.

For example, the value of the reference sensitivity and the reference value of the operational quantity of the Hall sensor element are identified at a reference temperature value, e.g. a constant temperature value. If the instantaneous value of the operational quantity of the Hall sensor element is now determined on the basis of the drive signal (supply signal) present at the Hall sensor element or the drive signals (supply signals) present at the Hall sensor element, the (instantaneous) sensitivity of the Hall sensor element may be directly identified therefrom on the basis of the reference sensitivity, the reference value of the operational quantity, the identified instantaneous value of the operational quantity, wherein the interdependency between the temperature dependence of the sensitivity and the temperature dependence of the operational quantity of the Hall sensor element is considered to this end.

Since the manufacturing technology, the respective setup and the semiconductor materials used have an influence on the interdependency between the temperature dependence of the sensitivity and the temperature dependence of the resistance or the operational quantity of a Hall sensor element derived therefrom, the interdependency may be identified for each type of Hall sensor element, and may be provided as a calculation rule, for example.

According to an embodiment, e.g., the Hall sensitivity of a Hall sensor element may be proportional to the charge carrier mobility, while the Hall resistance of the Hall sensor element may be indirectly proportional to the charge carrier mobility in the semiconductor material of the Hall sensor element.

In case of such an interdependency, for example, a resistance-normalized sensitivity of the Hall sensor element may be defined, which is indicated as a product of the reference sensitivity and the electrical reference resistance value of the Hall sensor element.

Thus, such a normalization of the sensitivity of the Hall sensor element may also be applied to the operational quantity/quantities of the Hall sensor element dependent on or derived from the instantaneous electrical resistance value of the Hall sensor element, so that an operational quantity-normalized sensitivity of the Hall sensor element may be provided "in general".

Thus, according to the above operational states (1.), (3.), (5.), the operational quantity-normalized sensitivity may be provided in the form of the operational quantity-sensitivity product $S_{XN}$ of the Hall sensor element as a product of the reference sensitivity $S_0$ and the reference value $X_0$ of the operational quantity X of the respective Hall sensor element, wherein the instantaneous sensitivity of the Hall sensor element may be determined on the basis of the quotient between the operational quantity-sensitivity product $S_{XN}$ and the instantaneous value of the operational quantity.

In addition, according to the above operational states (2.) and (4.), the operational quantity-normalized sensitivity may be provided in the form of the operational quantity-sensitivity quotient $S_{XN}$ of the Hall sensor element as a quotient of the reference sensitivity $S_0$ and the reference value $X_0$ of the operational quantity X of the respective Hall sensor element, wherein the instantaneous sensitivity of the Hall sensor element may be determined on the basis of the product between the operational quantity-sensitivity quotient $S_{XN}$ and the instantaneous value of the operational quantity.

Now, the above embodiments have in common that the instantaneous sensitivity of the Hall sensor element, i.e. the (temperature-dependent) deviation of the instantaneous sensitivity compared to the reference sensitivity value, may be determined, according to the respective operational mode, on the basis of the drive signal or the drive signals present (e.g. according to Ohm's law) of the Hall sensor element, enabling to perform the sensitivity determination of the Hall sensor element independently of calibration magnetic fields in an extremely efficient and quick manner.

According to a further embodiment of the inventive concept, the interdependency known, identified or specified between the temperature-dependent sensitivity and the temperature-dependent electrical resistance, or the operational quantity of the Hall sensor element dependent on or derived from the electrical resistance of the Hall sensor element, may now be "modelled" mathematically, i.e. the relationship between the temperature-related variation of the sensitivity and the temperature-related variation of the electrical resistance or the operational quantity of the Hall element dependent thereon or derived therefrom (=sensitivity-resistance relationship) may be reproduced mathematically, e.g. with the temperature as a variable.

According to the present concept, a (temperature-dependent) model $f_{SRN}(T)$ (=a mathematical function) for a sensitivity-resistance relationship (=resistance-normalized sensitivity) of a sensitivity and an electrical resistance or a sensitivity-operational quantity relationship (=operational quantity-normalized sensitivity) of a sensitivity and a derived operational quantity of the Hall sensor element with the temperature T as a variable may at first be provided.

For example, this may be done by identifying, i.e. retrieving, providing or measuring, a sensitivity value $S_N$ and an electrical resistance value $R_N$ or a value of the operational quantity $X_N$ of the Hall sensor element at a plurality of temperature values $T_N$ each. This corresponds to a calibration at the temperature values $T_1, T_2, \ldots$, wherein the mathematical model $f_{SRN}(T)$ for the sensitivity-resistance relationship of a sensitivity and an electrical resistance or for the sensitivity-operational quantity relationship of a sensitivity and a derived operational quantity of the Hall sensor element with the temperature (T) as a variable is then identified (on the basis of the measurement values of the electrical resistance value or the derived operational quantity and the sensitivity at the different temperatures).

Alternatively, for example, it is further possible to create the model $f_{SRN}(T)$ in a purely mathematical way if a "model" of the Hall sensor element based on the manufacturing technology used, the respective setup and the semiconductor materials used etc. for the sensor element is available.

According to the present concept, the instantaneous electrical resistance value or the instantaneous value of the operational quantity of the Hall sensor element is now determined, according to the operational mode, on the basis of a drive signal (=supply signal) applied or the drive signals (=supply signals) into the Hall sensor element, wherein the instantaneous temperature of the active area of the Hall sensor element is further determined (directly or indirectly). For example, determining the temperature directly means capturing a temperature of the active area, while determining the temperature indirectly means capturing a physical quantity that may be converted into the instantaneous temperature, or from which the instantaneous temperature is derivable, for example. Ultimately, the instantaneous sensitivity of the Hall sensor element (as an absolute value) may be determined on the basis of the value from the sensitivity-resistance relationship or for the sensitivity-operational quantity relationship, associated with the instantaneous temperature value, and the instantaneous value of the electrical resistance value or the operational quantity derived therefrom.

BRIEF DESCRIPTION OF THE DRAWINGS

Embodiments of the present invention will be detailed subsequently referring to the appended drawings, in which:

FIG. 1 shows a schematic flow diagram of a method for determining an instantaneous sensitivity of Hall sensor element according to an embodiment;

FIG. 5 shows a schematic flow diagram of a method for determining an instantaneous sensitivity of a Hall sensor element according to a further embodiment;

FIG. 6 shows a schematic flow diagram of a further method for determining an instantaneous sensitivity of a Hall sensor element according to a further embodiment;

DETAILED DESCRIPTION OF THE INVENTION

Figure 2A:
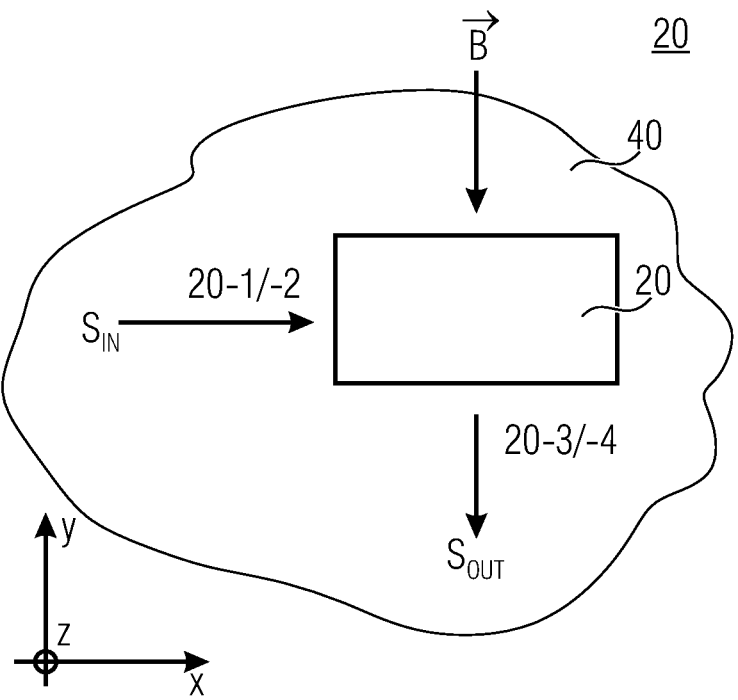
FIG. 2a shows a schematic diagram in a top view of a magnetic field sensor element (Hall sensor element) according to an embodiment.

Before subsequently describing embodiments of the present concept in detail on the basis of the drawings, it is to be noted that elements, objects, functional blocks and/or method steps being identical, functionally identical or having the same effect are provided with the same reference numerals in the different drawings, so that the description of these elements, objects, functional blocks and/or method steps illustrated in different embodiments may be interchanged or applied to each other.

Different embodiments are now described in more detail with reference to the accompanying drawings, in which some embodiments are illustrated. Dimensions of elements, layers and/or areas illustrated in the drawings, do not have to be illustrated true to scale, for clarification reasons.

It is understood that when an element is referred to as being "connected" or "coupled" to another element, it may be directly connected or coupled to the other element, or intermediate elements may be present. Conversely, when an element is referred to as being "directly" "connected" or "coupled" to another element, there are no intermediate elements. Other terms used to describe the relationship between elements should be construed in a similar fashion (e.g. "between" versus "directly between", "adjacent" versus "directly adjacent", and "on" versus "directly on", etc.).

Figure 2B:
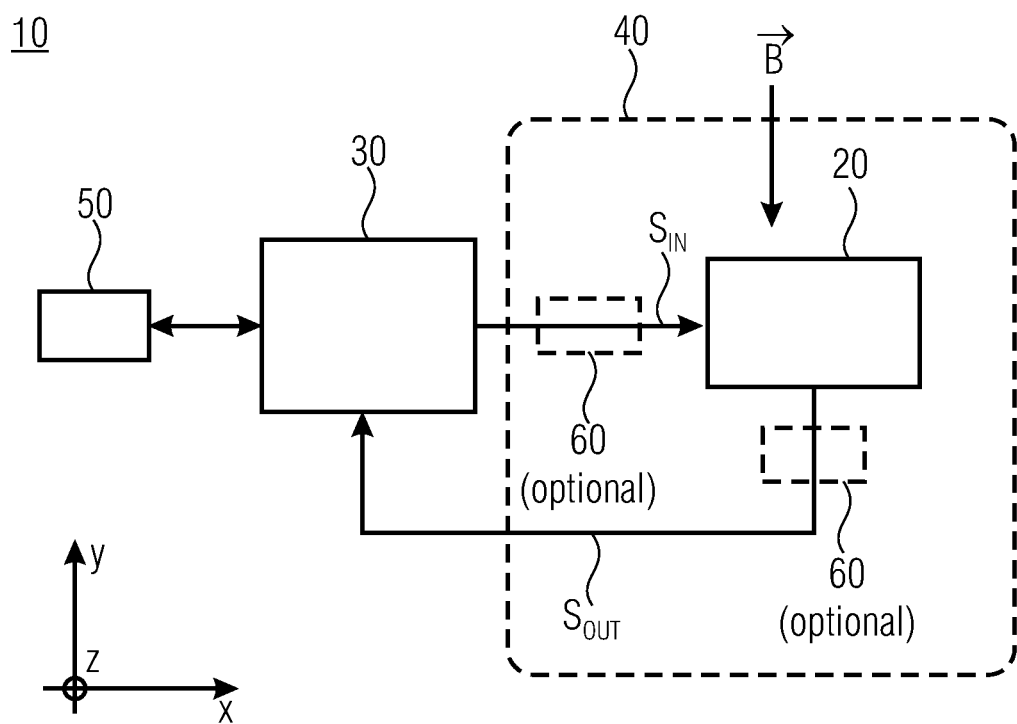
FIG. 2b shows a schematic diagram of a magnetic field sensor (Hall sensor) according to an embodiment, wherein the magnetic field sensor comprises at least one Hall sensor element.

For facilitating the description of the different embodiments, FIGS. 2a and 2b comprise a Cartesian coordinate system x, y, z, wherein the directions x, y, z are arranged orthogonally with respect to each other. In embodiments, the x-y plane corresponds to the main surface region of a carrier, or substrate (=a reference plane=x-y plane), wherein the direction vertically up with respect to the reference plane (x-y plane) corresponds to the "+z" direction, and wherein the direction vertically down with respect to the reference plane (x-y plane) corresponds to the "−z" direction. In the following description, the term "lateral" means a direction in parallel to the x- and/or y-direction, i.e. in parallel to the x-y-plane, wherein the term "vertical" means a direction in parallel to the +/−z-direction. In FIGS. 2a and 2b, the drawing plane extends in parallel to the x-y plane.

Subsequent embodiments relate to magnetic field sensors that may comprise one or several magnetic field sensor elements. Magnetic field sensor elements may be manufactured using semiconductor technology in a semiconductor substrate, wherein the semiconductor substrate may comprise a silicon material, for example. Subsequent embodiments relate to Hall sensor elements that may be configured as individual magnetic field-sensitive sensor elements, as well as to Hall sensors that may be configured as the sensor array with at least one or a plurality of individual Hall sensor elements and, e.g., the associated control circuit and (optionally) the evaluation circuit. The control circuit with the optional evaluation circuit is also referred to as the processing means.

With respect to the subsequent description of the embodiments of the inventive concept, it is to be noted that reference to a resistance or resistance value of the respective Hall sensor element, or its temperature dependence, may also be applied to an operational quantity, or its temperature dependence, that is dependent on or derived (derivable) from the electrical resistance (or resistance value) of the Hall sensor element.

In the following, a schematic flow diagram of a method 100 for determining an instantaneous sensitivity of Hall sensor element according to an embodiment is described on the basis of FIG. 1. For example, the Hall sensor element may be part of a Hall sensor.

For further explanation, reference is made to FIGS. 2a-b, wherein FIG. 2a illustrates a schematic diagram of a magnetic field sensor element 20 (Hall sensor element) according to an embodiment, and FIG. 2b illustrates a schematic top view of a magnetic field sensor 10 (Hall sensor) according to an embodiment, wherein the magnetic field sensor 10 comprises at least one Hall sensor element 20.

For example, the operational quantity X dependent on the electrical resistance value ($R_{Hall}$=$R_1$) of the Hall sensor element 20 (1.) may be the electrical resistance value $R_{Hall}$ of the Hall sensor element 20, or (2.) may further be the electrical conductivity value ($1/R_{Hall}$) of the Hall sensor element 20, or (3.) may be, in the voltage-controlled operation with a specified (or constant) supply voltage, the resulting (or applied) supply current of the Hall sensor element 20, or (4.) may be, in the current-controlled operation with a specified (or constant) supply current, the resulting (or applied) supply voltage of the Hall sensor element 20, or (5.) may be, in the free-running operation, the electrical resistance value $R_{Hall}$ or the electrical conductivity value ($1/R_{Hall}$) of the Hall sensor element (20), according to Ohm's law "R=U/I", based on the supply current or the supply voltage of the Hall sensor element (=$R_{Hall}$ at the operational point of the Hall sensor element).

Figure 3A:
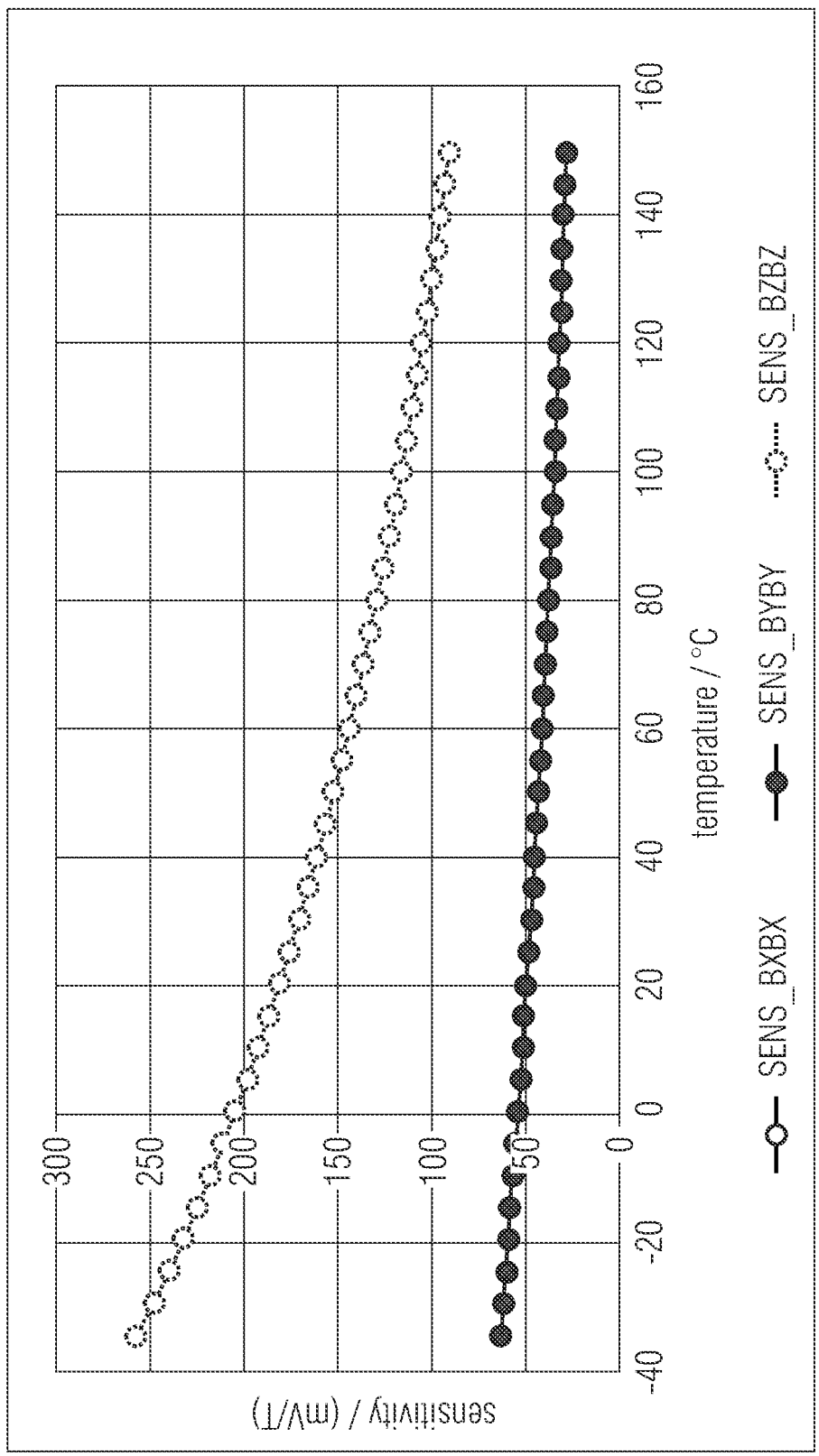
FIG. 3a shows an exemplary sensitivity progression of the Hall sensor element in the temperature range of −35° C. to 150° C. according to an embodiment.
Figure 3B:
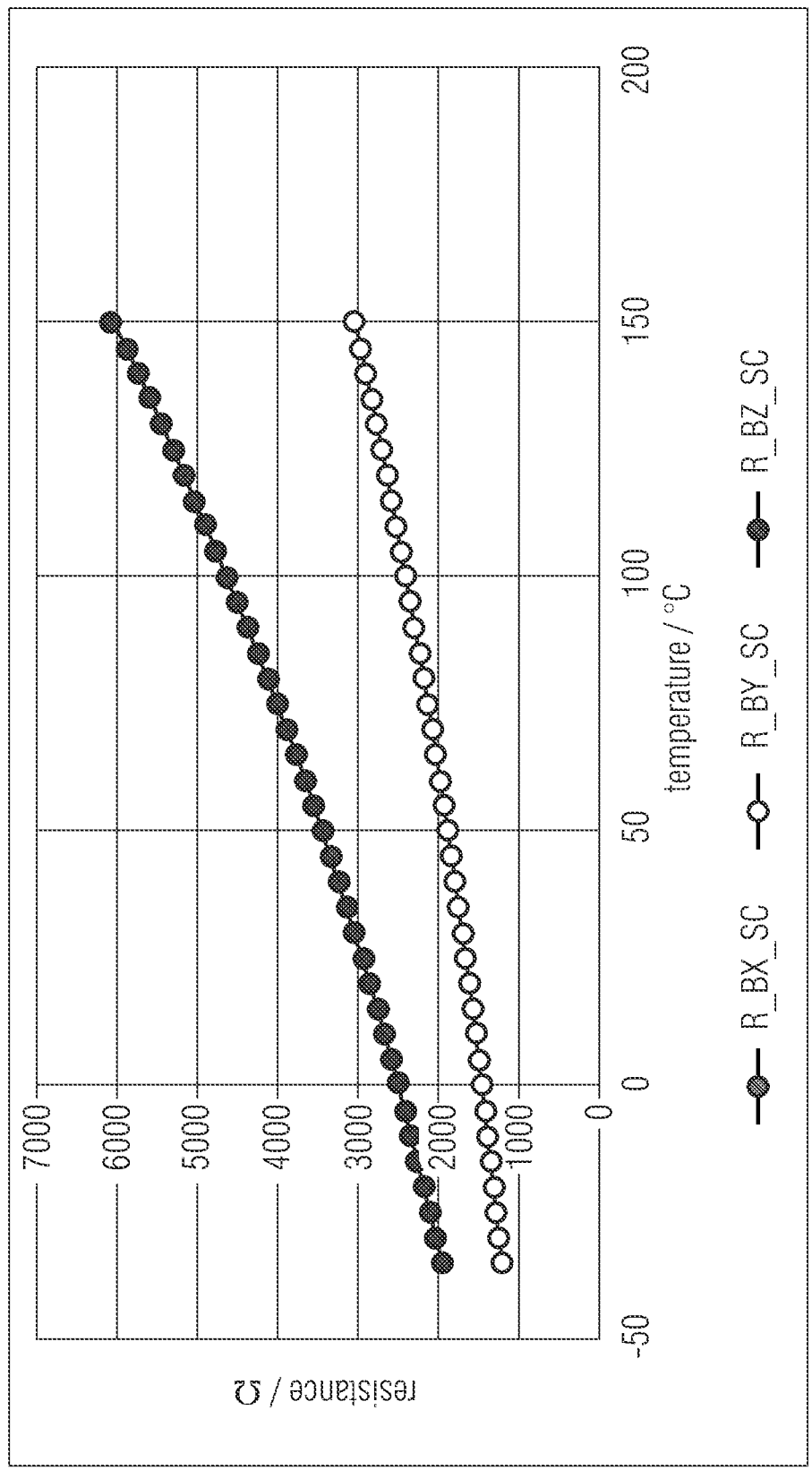
FIG. 3b shows an exemplary resistance progression of the Hall sensor element in the temperature range of −35° C. to 150° C. according to an embodiment.
Figure 3C:
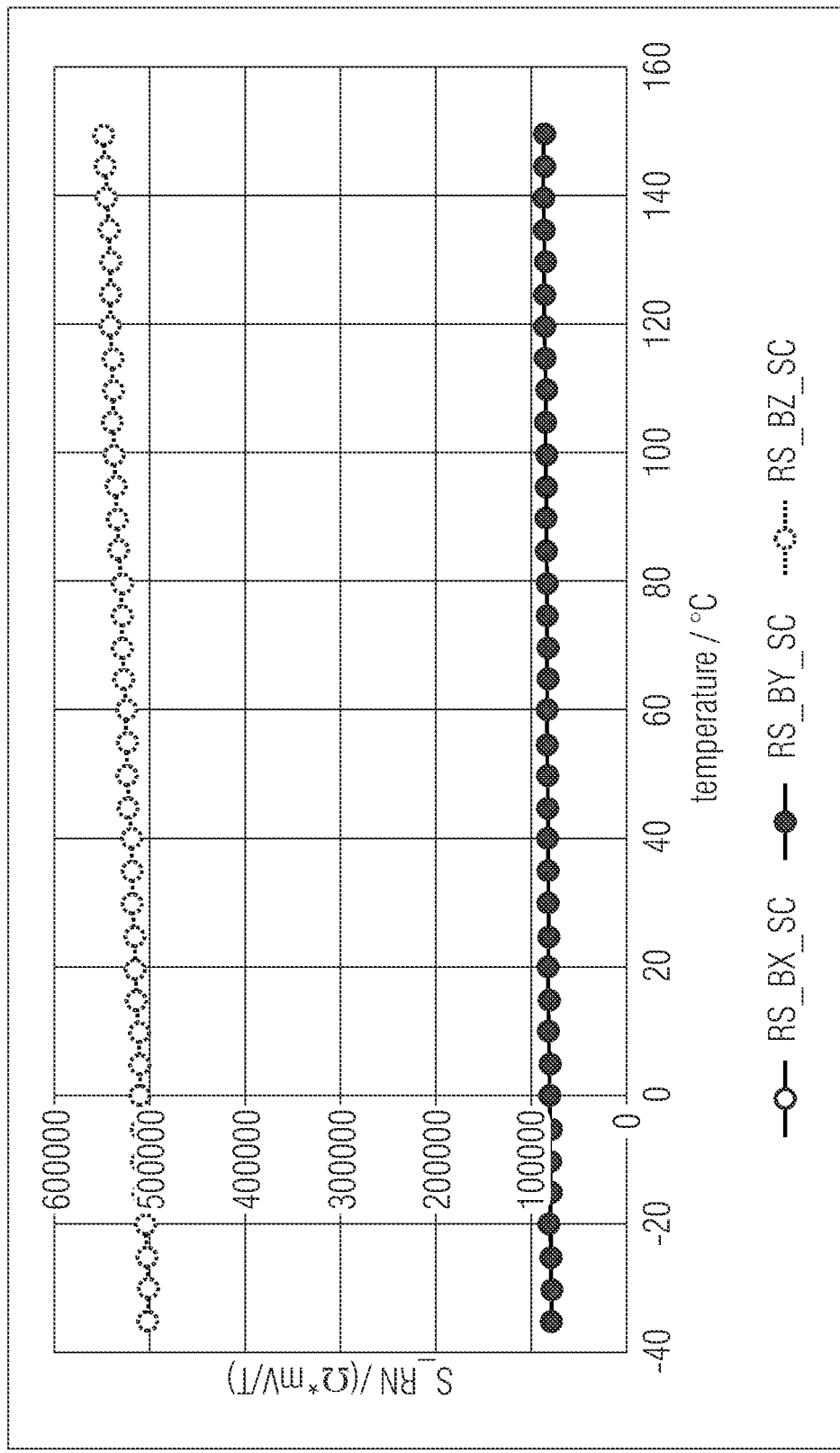
FIG. 3c shows an exemplary progression of the resistance-normalized sensitivity in the temperature range of −35° C. to 150° C. according to an embodiment.

For further explanation, reference is made to FIGS. 3a-c, wherein FIG. 3a exemplarily shows a (typical) sensitivity progression of the Hall sensor element in the temperature range of −35° C. to 150° C. FIG. 3b exemplarily shows a (typical) resistance progression of the Hall sensor element in the temperature range of −35° C. to 150° C. FIG. 3c exemplarily shows a (typical) progression of the resistance-normalized sensitivity in the temperature range of −35° C. to 150° C.

According to the respective operation type (on the basis of Ohm's law), the progressions of FIGS. 3a-c may also be illustrated for the operational quantity dependent on or derived from the electrical resistance (or resistance value) of the Hall sensor element and its temperature dependence.

As is exemplarily illustrated in FIG. 1, the method 100 for determining a sensitivity $S_{Hall}$, e.g. an instantaneous magnetic sensitivity, of the Hall sensor element 20, in consideration of an interdependency between the temperature dependence of the sensitivity $S_{Hall}$ and the temperature dependence of an operational quantity X dependent on the electrical resistance value $R_{Hall}$, e.g. the interval resistance or Hall resistance $R_{Hall}$, of the Hall sensor element 20, includes the following steps.

In step 110, a reference sensitivity $S_0$ and a reference value $X_0$ of the operational quantity X of the Hall sensor element 20 are identified, e.g. during an operational state for capturing reference values. In this case, the reference sensitivity $S_0$ and the reference value $X_0$ of the operational quantity X of the Hall sensor element 20, having associated a temperature value, may be identified, e.g. at a reference temperature value $T_0$. For example, identifying may include retrieving or providing the values for $S_0$ and/or $X_0$ from a memory 40 that the processing means 30 may access, or measuring and/or capturing the values for $S_0$ and/or $X_0$.

In step 120, an instantaneous value $X_1$ of the operational quantity X of the Hall sensor element 20 is determined on the basis of a drive signal $S_{IN}$ of the Hall sensor element 20, e.g. during an operational state for capturing instantaneous values. As indicated above, a type of operation, or an operational state, may be a voltage-controlled operation, a current-controlled operation, or a free-running operation of the Hall sensor element 20.

Now, in step 130, the (instantaneous) sensitivity $S_{Hall}$ of the Hall sensor element is determined on the basis of the reference sensitivity $S_0$, the reference value $X_0$ of the operational quantity X, the instantaneous value $X_1$ of the operational quantity X, and the interdependency.

According to the embodiment, the present concept relates to a known, identified or specified interdependency between the temperature dependence of the sensitivity $S_{Hall}$ and the temperature dependence of the operational quantity X of the Hall sensor element 20 dependent on or derived from the electrical resistance (or resistance value) of the Hall sensor element 20, wherein the sensitivity of the Hall element and the operational quantity X of the Hall sensor element derived therefrom vary across the temperature, and wherein the temperature-related variation of the sensitivity $S_{Hall}$ and the temperature-related variation of the operational quantity X of the Hall element derived therefrom are in a relationship that is specified, for example. This interdependency, or this specified relationship, is now used to gather via the variation of the operational quantity X of the Hall sensor element, i.e. via the comparison of the instantaneous value of the operational quantity X of the Hall sensor element with a reference measurement value of the operational quantity X of the Hall sensor element, the instantaneous sensitivity $S_{Hall}$ of the Hall sensor element 20, i.e. to gather any variation compared to the reference sensitivity value $S_0$ of the Hall sensor element 20.

For example, the reference sensitivity, or the reference sensitivity value, $S_0$, and the reference value $X_0$ of the operational quantity X of the Hall sensor element 20 are identified at a reference temperature value, e.g. at a specified (or constant) temperature value $T_0$. If the instantaneous value $X_1$ of the operational quantity X of the Hall sensor element is now determined on the basis of the drive signal $S_{IN}$ applied to the Hall sensor element 20, the (instantaneous) sensitivity $S_{Hall}$ of the Hall sensor element 20 can be directly identified therefrom on the basis of the reference sensitivity $S_0$, the reference value $X_0$ of the operational quantity X, and the identified instantaneous value of the operational quantity $X_1$, wherein the interdependency between the temperature dependence of the sensitivity $S_{Hall}$ and the temperature dependence of the operational quantity X of the Hall sensor element 20 is considered to this end.

Now, since the manufacturing technology, the respective setup, and the semiconductor materials used have an influence on the interdependency between the temperature dependence of the sensitivity $S_{Hall}$ and the temperature dependence of the operational quantity X of the Hall sensor element 20, the interdependency may be identified for each type of Hall sensor element and may be provided as a calculation rule, for example.

For further explanation, reference is made to FIGS. 2a-b, wherein FIG. 2a illustrates a schematic diagram of a magnetic field sensor element (Hall sensor element) 20 according to an embodiment, and FIG. 2b illustrates a schematic view of a magnetic field sensor (Hall sensor) 10 according to an embodiment, wherein the magnetic field sensor 10 comprises at least one Hall sensor element 20. For example, the Hall sensor element 20 may be part of a Hall sensor 10.

As is exemplarily illustrated in FIG. 2b, the Hall sensor 10 comprises the at least one Hall sensor element 20 and a processing means 30 configured for performing the method 100. In particular, the processing means 30 may implemented as a control means for feeding the respective drive signal $S_{IN}$, e.g. a current or a voltage, into the at least one Hall sensor element 20 or the plurality of Hall sensor elements 20, and optionally for reading-out the output signal $S_{OUT}$, e.g. of the Hall voltage $U_{Hall}$, of the respective Hall sensor element 20.

According to an embodiment, the method 100 for determining a sensitivity may also be applied in case of a Hall sensor 10 with a plurality of Hall sensor element 20 so as to determine the respective sensitivity of the individual Hall sensor elements 20 of the Hall sensor 10. Thus, the Hall sensor may comprise a plurality (≥2) of Hall sensor element 20, wherein the steps of the method may be performed for each Hall sensor element or for each Hall sensor element of a different type of the plurality of Hall sensor elements 20.

According to an embodiment, the plurality of Hall sensor elements comprises at least one Hall sensor element 20 of a first sensor type and a further Hall sensor element 20' of a further sensor type that differs from the first sensor type. Thus, the Hall sensor element 20 and the further Hall sensor element 20' may comprise a different temperature drift of the respective sensitivity. According to an embodiment, the Hall sensor element 20 comprises a lateral Hall sensor element, wherein the further Hall sensor element 20' comprises a vertical Hall sensor element.

Subsequent embodiments relate to Hall sensor elements 20 that may be configured as individual magnetic field-sensitive sensor elements 20, and to Hall sensors 10 that may be configured as the sensor array with at least one or a plurality of individual Hall sensor elements 20, and, e.g., the associated control circuit and (optionally) the evaluation circuit. The control circuit with the optional evaluation circuit is also referred to as the processing means 30.

For example, lateral Hall sensor elements 20 are thin doped semiconductor layers in a substrate material 40 (in the x-y plane) and comprise four (or more) electrodes 20-1..., 20-4, for example. A drive signal $S_{IN}$, e.g. a current or a voltage, is fed in (applied) by means of two opposite electrodes 20-1/-2, the two electrodes 20-3/-4 arranged orthogonally thereto function for the pick-up of the output signal $S_{OUT}$, i.e. the Hall voltage $U_{Hall}$. If a magnetic field B, or a resulting magnetic field component $B_Z$, extending perpendicularly (vertical=in parallel to the Z-direction) to the layer flows through such a lateral Hall sensor element 20, the Hall sensor element 20 provides an output voltage $S_{OUT}$ that is proportional to the (signed) absolute value of the vector product of the magnetic flux density B and the current intensity. This is caused by the Lorentz force acting on the moving majority charge carriers in the active semiconductor layer.

Vertical Hall sensor elements 20 extend vertically into the semiconductor substrate and are contacted at their surface area. If a magnetic field, or resulting magnetic field component, extending in parallel (lateral=in parallel to the x-y plane) to the substrate surface flows through such a vertical Hall sensor element, the Hall sensor element provides an output voltage that is proportional to the (signed) absolute value of the vector product of the magnetic flux density and the current, due to the Lorentz force acting on the moving majority charge carriers in the Hall sensor element.

According to an embodiment, the Hall sensor 10 may comprise a plurality (≥2) of Hall sensor elements 20 configured for two-dimensionally capturing a magnet field B, e.g. in a reference point, along two linearly independent position vectors or orthogonal position vectors. in a 2D Hall sensor 10, for example, at least two Hall sensor elements 20 are arranged such that their sensitivity directions (preferably starting from a mutual point of origination or center point) are aligned along two orthogonal spatial axes.

According to an embodiment, the Hall sensor 10 may comprise a plurality (≥3) of Hall sensor elements 20 that are configured for three-dimensionally capturing a magnetic field B, e.g. in a reference point, along three linearly independent position vectors or orthogonal position vectors. In a 3D Hall sensor 10, for example, at least three Hall sensor elements 20 are arranged such that their sensitivity directions (preferably starting from a mutual point of origin or center point) are aligned along the three orthogonal spatial axes.

According to an embodiment, the operational current $S_{IN}$ applied to the Hall sensor element 20 may be decoupled by means of a current mirror circuit 60 in order to determine the reference value $X_0$ and/or the instantaneous value $X_1$ of the operational quantity X of the Hall sensor element 20. The current mirror circuit 60 may be arranged on the input side or the output side with respect to the Hall sensor element 20.

In an optional further step 140, the instantaneous sensitivity $S_{Hall}$ ($=S_1$) of the Hall sensor element 20 is determined on the basis of the reference sensitivity $S_0$ and the ratio between the reference value $X_0$ of the operational quantity X and the identified instantaneous value $X_1$ of the operational quantity X of the Hall sensor element 20.

Thus, according to an embodiment, a variation of the ratio between the reference value $X_0$ of the operational quantity X and the identified instantaneous value $X_1$ of the operational quantity X may correspond to a variation of the sensitivity $S_{Hall}$ of the Hall sensor element 20.

For example, according to an embodiment, the Hall sensitivity $S_{Hall}$ of a Hall sensor element 20 may be proportional to the charge carrier mobility μ, whereas the operational quantity X of the Hall sensor element 20 may be indirectly proportional to the charge carrier mobility μ in the semiconductor material (=active area) of the Hall sensor element 20.

In case of such an interdependency, for example, an operational size-normalized sensitivity of the Hall sensor element 20 may be defined, which is indicated as a "product" of the reference sensitivity $S_0$ and the reference value $X_0$ of the operational quantity X of the Hall sensor element 20. For example, this is the case if the operational quantity X dependent on the electrical resistance value ($R_{Hall}=R_1$) of the Hall sensor element 20 – is the electrical resistance value $R_{Hall}$ of the Hall sensor element 20, – is, in the voltage-controlled operation, the supply current $S_{IN}$ of the Hall sensor element 20, or (–) is, in the free-running operation, the electrical resistance value $R_{Hall}$ of the Hall sensor element 20 (according to Ohm's Law R=U/I) based on the supply current and the supply voltage of the Hall sensor element (=$R_{Hall}$ in the operational point of the Hall sensor element).

Thus, the method 100 may further comprise a step 150 of determining 150 an operational quantity-sensitivity product $S_{XN}$ of the Hall sensor element 20 as a product of the reference sensitivity $S_0$ and the reference value $X_0$ of the operational quantity X of the respective Hall sensor element 20 according to the following relationship (equation 1):

$$S_{XN}=S_0*X_0 (\text{=operational quantity-normalized sensitivity } S_{Hall})$$

According to an embodiment, the method 100 may further comprise a further step of determining 160 the (instantaneous) sensitivity $S_{Hall}$ of the Hall sensor element 20 on the basis of the following relationship (equation 2):

$$S_{Hall}=X_0/X_1*S_0=S_{XN}/X_1, (\text{=instantaneous Hall sensitivity})$$

with $X_0$=reference value of the operational quantity
$X_1$=instantaneous value of the operational quantity
$S_{XN}$=operational quantity-sensitivity product
of the respective Hall sensor element.

In the above-illustrated interdependency (when the Hall sensitivity $S_{Hall}$ of a Hall sensor element 20 is proportional to the charge carrier mobility μ, while the operational quantity $S_X$ of the Hall sensor element 20 is indirectly proportional to the charge carrier mobility μ in the semiconductor material (=active area) of the Hall sensor element 20, e.g., an operational quantity-normalized sensitivity of the Hall sensor element 20 may also be defined, which is indicated as a "quotient" of the reference sensitivity $S_0$ and the reference $X_0$ of the operational quantity X of the Hall sensor element. For example, this is the case if the operational quantity X dependent on the electrical resistance value ($R_{Hall}=R_1$) of the Hall sensor element 20 – is the electrical conductivity value ($1/R_{Hall}$) of the Hall sensor element (20), is, e.g. in the free-running operation, the electrical conductivity value ($1/R_{Hall}$) of the Hall sensor element 20 (according to Ohm's law R=U/I) based on the supply current and the supply voltage of the Hall sensor element (=$R_{Hall}$ in the operational point of the Hall sensor element), or (–) is, in the current-controlled operation, the supply voltage of the Hall sensor element 20).

Thus, the method 100 may further comprise a step 180 of determining a sensitivity-operational quantity quotient ($S_{XN}$) of the respective Hall sensor element (20) as a quotient of the reference sensitivity ($S_0$) and the reference value ($X_0$) of the operational quantity (X) of the respective Hall sensor element (20) according to the following relationship (equation 3):

$$S_{XN}=S_0/X_0 (\text{=operational quantity-normalized sensitivity } S_{Hall})$$

wherein the operational quantity X dependent on the electrical resistance value ($R_{Hall}=R_1$) of the Hall sensor element 20 (–) is the electrical conductivity value ($1/R_{Hall}$) of the Hall sensor element 20, is, e.g. in the free-running operation, the electrical conductivity value ($1/R_{Hall}$) of the Hall sensor element 20 (according to Ohm's law R=U/I) based on of the supply current and the supply voltage of the Hall sensor element (=$R_{Hall}$ in the operational point of the Hall sensor element), or (–) is, in the voltage-control operation, the supply current of the Hall sensor element 20.

Thus, the method 100 may further comprise a step of determining 190 the (instantaneous) sensitivity S of the respective Hall sensor element on the basis of the following relationship (equation 4):

$$S_{Hall}=X_1/X_0*S_0=S_{XN}*X_1, (\text{=instantaneous Hall sensitivity})$$

with $X_0$=reference value of the operational quantity
$X_1$=instantaneous value of the operational quantity
$S_{XN}$=sensitivity-operational quantity quotient
of the respective Hall sensor element 20.

The above embodiments of the method 100 now have in common that the instantaneous sensitivity $S_{Hall}$ of the Hall sensor element 20, i.e. the (temperature-dependent) deviation of the instantaneous sensitivity $S_{Hall}$ compared to reference sensitivity, may be determined on the basis of the applied drive signal $S_{IN}$ of the Hall sensor element 20, which makes it possible to perform the sensitivity of determination of the Hall sensor element 20 independently of calibration magnetic fields, etc. in an extremely efficient and quick way.

According to a possible application scenario, the method 100 may be used to obtain sensitivity synchronism in case of Hall sensors 10 with several Hall sensor elements 20, such as in case of 2D or 3D Hall sensors, and generally in case of ratiometric measurement systems. According to an embodiment, the Hall sensor 10 comprise a plurality (≥2) of Hall sensor elements 20 and is part of a ratiometric measurement system.

In ratiometric measurement systems, such as angular sensors, synchronism of the vertical and horizontal Hall sensor elements 20 is important. As described above, the (temperature-related) drift of the sensitivity $S_{Hall}$ affects the (two) different sensor types differently. This leads to measurement errors. Consequently, sensor arrays 10 for ratiometric measurements are currently often selected such that the magnetic field B to be measured is only present in the X/Y direction or is only present in Z direction at the Hall sensor elements 20 (e.g. vertical Hall sensor elements 20) of the Hall sensor 10.

Figure 4A:
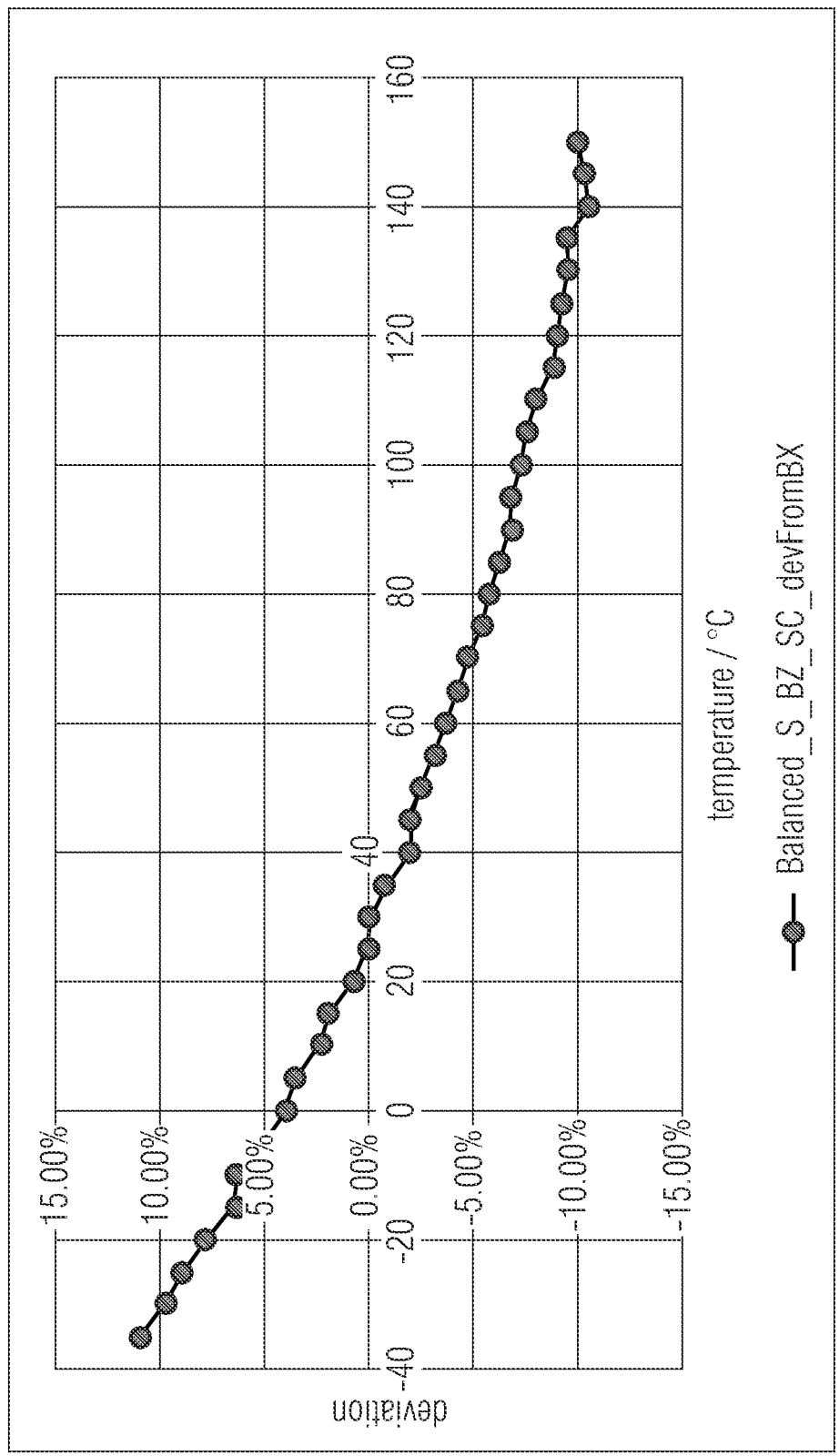
FIG. 4a shows an exemplary progression of a deviation of the sensitivity $B_Z$ compared to $B_X$ after a balancing (alignment) of $B_Z$ to $B_X$ at 25° C. (spinning current) according to an embodiment.

To show the difference in the sensitivity drift of different Hall sensor elements, such as lateral and vertical Hall sensor elements, the ratio of the sensitivities $S_{Hall}$ of both sensor types was formed at 25° C. ($B_Z/B_X$) and subsequently, the sensitivities $S_{Hall}$ of the Z sensor was divided by these quotients at each location across temperature ($B_Z$ balanced to $B_X$), c.f. FIG. 4a, for example.

The method 100 for determining an instantaneous sensitivity of a Hall sensor element 20 illustrated on the basis of FIG. 1 is now described exemplarily with the electrical resistance value $R_{Hall}$ (internal resistance or Hall resistance) as the operational quantity X of the Hall sensor element 20.

Thus, the method 100 for determining a sensitivity $S_{Hall}$, e.g. an instantaneous magnetic sensitivity, of a Hall sensor element 20, in consideration of a known, e.g. identified or specified, interdependency between the temperature dependence of the sensitivity $S_{Hall}$ and the temperature dependence of the electrical resistance $R_{Hall}$, e.g. the internal resistance or overall resistance, of the Hall sensor element 20 comprises the following steps.

In step 110, a reference sensitivity $S_0$ and an electrical reference resistance value $R_0$ of the Hall sensor element are identified. In this case, the reference sensitivity $S_0$ and the electrical reference resistance value $R_0$ of the Hall sensor element 20, associated with a temperature value, may be identified at a temperature value $T_0$, for example. For example, identifying may include retrieving or providing the value for $S_0$ and/or $R_0$ from a memory 40 accessible for the processing means 30, or measuring and/or capturing the value for $S_0$ and/or $R_0$.

In step 120, an instantaneous electrical resistance value $R_1$ of the Hall sensor element is determined on the basis of a drive signal $S_{IN}$, e.g. a control current applied or a control voltage applied, to the Hall sensor element 20.

In step 130, the (instantaneous) sensitivity $S_{Hall}$ of the Hall sensor element is now determined on the basis of the reference sensitivity $S_0$, the electrical reference resistance value $R_0$, the identified instantaneous electrical resistance value $R_1$ ($=R_{Hall}$), and the interdependency.

According to the embodiment, the present concept relates to a known, identified or specified interdependency between the temperature dependence of the sensitivity $S_{Hall}$ and the temperature dependence of the electrical resistance $R_{Hall}$ of the Hall sensor element 20, wherein the sensitivity of the Hall element and the electrical resistance of the Hall element vary across the temperature, and wherein the temperature-related variation of the sensitivity $S_{Hall}$ and the temperature-related variation of the resistance $R_{Hall}$ of the Hall element are in a (specified) relationship with each other. This interdependency, or this specified relationship, is now used to gather via the variation of the electrical resistance of the Hall element, i.e. via the comparison of the instantaneous resistance value of the Hall sensor element with a reference measurement value of the resistance of the Hall sensor element, the instantaneous sensitivity ($S_{Hall}$) of the Hall sensor element 20, i.e. any variation compared to the reference sensitivity value $S_0$ of the Hall sensor element 20.

The reference sensitivity (or the reference sensitivity value) $S_0$ and the electrical reference resistance value $R_0$ of the Hall sensor element 20 are identified at a reference temperature value (=a constant temperature value) $T_0$, for example. If the instantaneous electrical resistance value $R_1=R_{Hall}$ of the Hall sensor element is now determined on the basis of a drive signal $S_{IN}$ applied to the Hall sensor element 20, according to Ohm's law, the (instantaneous) sensitivity $S_{Hall}$ of the Hall sensor element 20 may be directly identified therefrom on the basis of the reference sensitivity $S_0$, the electrical reference resistance value $R_0$, and the identified instantaneous electrical resistance value $R_1$, wherein the interdependency between the temperature dependence of the sensitivity $S_{Hall}$ and the temperature dependence of the resistance value $R_{Hall}$ of the Hall sensor element 20 are considered to this end.

Since the manufacturing technology, the respective setup, and the semiconductor materials used have an influence on the interdependency between the temperature dependence of the sensitivity $S_{Hall}$ and the temperature dependence of the resistance $R_{Hall}$ of a Hall sensor element 20, the interdependency may be identified for each type of Hall sensor element, and may be provided as a calculation rule, for example.

In the optional further step 140, according to an embodiment, the instantaneous sensitivity $S_{Hall}$ ($=S_1$) of the Hall sensor element 20 is determined on the basis of the reference sensitivity $S_0$ and the ratio (as an example for the interdependency) between the reference resistance value $R_0$ and the identified instantaneous electrical resistance value $R_1$ of the Hall sensor element.

For example, according to an embodiment, the Hall sensitivity $S_{Hall}$ of a Hall sensor element 20 may be proportional to the charge carrier mobility $\mu$, while the Hall resistance $R_{Hall}$ of the Hall sensor element 20 may be indirectly proportional to the charge carrier mobility $\mu$ in the semiconductor material (=active area) of the Hall sensor element 20.

In case of such an interdependency, for example, a resistance-normalized sensitivity of the Hall sensor element 20 may be defined, which is indicated as a "product" of the reference sensitivity $S_0$ and the electrical reference resistance value $R_0$ of the Hall sensor element.

The following exemplarily illustrates some physical and technological relations in case of Hall sensor elements 20, however, it is to be noted that the respectively used manufacturing technology, the respective setup, and the semiconductor materials used have an influence on the interdependency between the temperature dependence of the sensitivity and the temperature of the resistance of the Hall sensor element, so that the subsequent explanations as to the interdependency should be regarded as examples.

Embodiments of the inventive method 100 for determining an instantaneous sensitivity of a Hall sensor element 20 are characterized by the fact that the sensitivity $S_{Hall}$ of the Hall sensor element 20 is observable and therefore indirectly measurable in its electrical resistance $R_{Hall}$. The basis of the inventive concept is the link of the sensitivity $S_{Hall}$ of the Hall sensor element 20 with its electrical resistance $R_{Hall}$.

In the voltage-controlled operation, the sensitivity $S_{Hall}$ of a Hall sensor element 20 is defined by the following equation (5):

$$S_{Hall} = \mu \frac{b}{l} U_{Hallsup}$$

with the charge carrier mobility $\mu$, the width b and the length l of the sensor as well as its drive signal $S_{IN}$ (e.g. here the operational voltage $U_{HALLSUP}=S_{IN}$). The operational voltage of the Hall sensor element 20 is regulated to a constant value, for example. The geometry of the Hall sensor element also remains constant after manufacturing. Thus, the cause of the temperature drift of the sensitivity $S_{Hall}$ of the Hall sensor element 20 is a variation of the charge carrier mobility $\mu$. Since the vibration of the phonons increases with an increase of temperature in the semiconductor material of the Hall sensor element 20, the mobility $\mu$ of the charge carriers and therefore the sensitivity $S_{Hall}$ of the sensor element 20 decreases, as can be seen in FIG. 3a. FIG. 3a exemplarily shows a (typical) sensitivity progression of the Hall sensor element in the temperature range of −35° C. to 150° C.

A Hall sensor element may be regarded as a Wheatstone resistance measurement bridge. The overall resistance of the Hall sensor element 20 is calculated with its material characteristics, the doping material concentration n, the charge q, the charge carrier mobility $\mu$ as well as its geometry of the length l and cross-sectional area A, according to the following equation (6):

$$R_{Hall} = \frac{1}{q\,\mu\,n}\frac{l}{A}$$

The doping material concentration n is predetermined by the manufacturing process of the Hall sensor element 20. The sensor-geometrical parameters l and A are determined during the development of the Hall sensor element. Thus, one can assume that the drift characteristics of the Hall sensor resistance $R_{Hall}$ are defined by the charge carrier mobility μ. In the direct comparison with the sensitivity $S_{Hall}$ in equation (5), the drift characteristic of the resistance $R_{Hall}$ is indirectly proportional. This confirms the measurement of the resistance of a Hall sensor element, which is exemplarily illustrated in FIG. 3b. FIG. 3b exemplarily shows a (typical) resistance progression of the Hall sensor element in the temperature range of
−35° C. to 150° C.

Both values $S_{Hall}$ and $R_{Hall}$ may be processed with each other to a so-called resistance-normalized sensitivity, according to the relationship or equation (7):

$$S_{RN} = S_{Hall} * R_{Hall}$$

FIG. 3c exemplarily shows a (typical) progression of the resistance-normalized sensitivity in the temperature range of −35° C. to 150° C. The additional information may be advantageously used in ratiometric and absolute value-based measurement systems 10, as will be described in the following.

Since, in the voltage-controlled operation, as mentioned above, the supply voltage $S_{IN}=V_{HALLSUP}$ of the Hall sensor element 20 is controlled to constant value, a measurement of the (resulting) sensor current through the Hall sensor element 20 is sufficient to capture the electrical resistance $R_1$. This may be done in the case of integrated Hall sensor systems 10 on the respective chip 40 itself, and also externally. For different operational types of Hall sensors 10 or Hall sensor elements 20, there are different measurement variables for capturing the electrical resistance $R_{Hall}$ of the sensor 10 of the sensor element 20:

A) Voltage-controlled operation: measurement/identification of the Hall sensor supply current, since the supply voltage is firmly set or specified
B) Current-controlled operation: measurement/identification of the Hall sensor supply voltage, since the supply current is firmly set or specified
C) Unregulated (free-running) Hall sensor: measurement/identification of the supply current as well as the supply voltage (so as to identify the operational point)

On the basis of the different operation types A, B, and C of Hall sensors 10 or Hall sensor elements 20, it becomes clear that the inventive method 100 for determining a sensitivity $S_{Hall}$ of a Hall sensor element 20 according to FIGS. 1-4 and the (subsequently described) inventive method 200 for determining a sensitivity $S_{Hall}$ of Hall sensor element 20 according to FIGS. 5 and 6 are related to the link of the electrical resistance (resistance value) and the sensitivity (sensitivity value) of a Hall sensor element.

According to embodiments, alternatively or additionally to the electrical resistance of the respective Hall element 20, a quantity X (reference quantity $X_0$, instantaneous quantity $X_1$) dependent on or derived from the electrical resistance value $R_{Hall}$ of the sensor element 20 may be identified. Thus, the temperature-related variation of the sensitivity $S_{Hall}$ of the Hall sensor element 20 may be gathered from the variation of the ratio between the electrical reference quantity $X_0$ and the identified instantaneous quantity $X_1$.

Operation type A: in case of the firmly set or specified supply voltage, the identified Hall sensor supply current is the quantity X dependent on (or derived from) the electrical resistance value $R_{Hall}$ of the sensor element 20 (with the reference quantity=reference current value $X_0$, and the instantaneous quantity=instantaneous current value $X_1$).

Operation type B: in case of the firmly set or specified supply current, the identified Hall sensor supply voltage is the quantity X dependent on (or derived from) the electrical resistance value $R_{Hall}$ of the Hall sensor element 20 (with the reference quantity=reference voltage value $X_0$ and the instantaneous quantity=instantaneous voltage value $X_1$).

Operation type C: the ratio of the identified Hall sensor supply voltage and the identified Hall sensor supply current is the quantity X dependent on (or derived from) the electrical resistance value ($R_{Hall}$) of the sensor element (20) (with the reference quantity $X_0$ and the instantaneous quantity $X_1$). The quantity X dependent on (or derived from) the electrical resistance value $R_{Hall}$ of the sensor element 20 (with the reference quantity $X_0$ and the instantaneous quantity $X_1$) may be the electrical resistance itself or the electrical conductivity value of the sensor element 20. Thus, according to Ohm's law, the quantity X may be determined from the identified Hall sensor supply voltage and the identified Hall sensor supply current.

In the description of the inventive embodiments, the terms electrical resistance (resistance value) or operational quantity X dependent on or derived from the electrical resistance value $R_{Hall}$ of the sensor element 20 (identified Hall sensor supply current, identified Hall sensor supply voltage and/or identified ration of Hall sensor supply current and Hall sensor supply voltage) may be used.

The described method 100 and the application scenarios described in the following paragraphs are applicable to all types of Hall sensors 10 or Hall sensor elements 20, discrete or integrated.

Thus, according to the described embodiment, in the optional further step 140, the instantaneous sensitivity $S_{Hall}$ of the Hall sensor element 20 is determined on the basis of the reference sensitivity $S_0$ and the ratio (=an example of the interdependency) between the electrical reference resistance value $R_0$ and the identified instantaneous electrical resistance value $R_1$ of the Hall sensor element 20.

According to an embodiment, e.g., the Hall sensitivity $S_{Hall}$ of the Hall sensor element 20 is proportional to the charge carrier mobility μ, while the Hall resistance $R_{Hall}$ of the Hall sensor element 20 is indirectly proportional to the charge carrier mobility μ in the semiconductor material of the Hall sensor element 20.

Thus, it may be assumed that a variation of the ratio between the electrical reference resistance value $R_0$ (or the reference value $X_0$ of the operational quantity X) and the identified instantaneous electrical resistance value $R_{Hall}=R_1$ (or the instantaneous value $X_1$ of the operational quantity X) corresponds to a variation of the sensitivity $S_{Hall}$ of the Hall sensor element 20 within a tolerance range of less than 30%, 20%, 10%, 5%, 1%, or 0.1%, for example.

Thus, the tolerance range indicates the range within which the temperature-related variation of the sensitivity $S_{Hall}$ of the Hall sensor element 20 may be gathered from the variation of the ratio between the electrical reference resistance value $R_0$ and the identified instantaneous electrical resistance value $R_1$. The smaller the tolerance range that can be kept, the more precise the instantaneous sensitivity determination $S_{Hall}$ and therefore the temperature calibration.

In case of such an interdependency, for example, the resistance-normalized sensitivity of the Hall sensor may be defined, which is indicated as a product (cf. equation 7 above) of the reference sensitivity and the electrical reference resistance value of the Hall sensor element.

Thus, the method 100 may further comprise a step 150 of determining the resistance-sensitivity product (=resistance-normalized sensitivity) $S_{RN}$ of the Hall sensor element as a product of the reference sensitivity $S_0$ and the electrical reference resistance value $R_0$ of the respective Hall sensor element, according to the relationship of equation (7). According to an embodiment, the method 100 may additionally comprise a further step of determining 160 the (instantaneous) sensitivity $S_{Hall}$ of the Hall sensor element 20 on the basis of the following relationship (equation 8):

$$S_{Hall}=R_0/R_1*S_0=S_{RN}/R_1, (=\text{instantaneous Hall sensitivity})$$

with $R_0$=electrical reference resistance value
$R_1$=instantaneous electrical resistance value
$S_{RN}$=resistance-sensitivity product
of the respective Hall sensor element 20.

According to a possible application scenario, the method 100 may be used to obtain sensitivity synchronism in case of Hall sensors 10 with several Hall sensor elements 20, such as in case of 2D or 3D Hall sensors and, in general, in case of ratiometric measurement systems. According to an embodiment, the Hall sensor 10 comprises a plurality ($\geq 2$) of Hall sensor elements 20 and is part of a ratiometric measurement system.

In ratiometric measurement systems, such as angular sensors, synchronism of the vertical and horizontal Hall sensor elements 20 is important. As described above, the (temperature-related) drift of the sensitivity $S_{Hall}$ affects the (two) different sensor types differently. This leads to measurement errors. Consequently, sensor arrays 10 for ratiometric measurements are currently often selected such that the magnetic field B to be measured is only present in the X/Y direction or only in the Z direction at the Hall sensor elements 20 (e.g. the vertical Hall sensor elements 20) of the Hall sensor 10.

To show the difference in the sensitivity drift of different Hall sensor elements, e.g. lateral and vertical Hall sensor elements, the ratio of the sensitivity $S_{Hall}$ of both sensor types was formed at 25° C. ($B_Z/B_X$) and, subsequently, the sensitivity $S_{Hall}$ of the Z sensor was divided by this quotient at each location across the temperature ($B_Z$ balanced to $B_X$). FIG. 4a shows an exemplarily progression of the deviation of the sensitivity of $B_Z$ compared to $B_X$ after the balancing of $B_Z$ to $B_X$ at 25° C. (spinning current). FIG. 4a clearly shows that the drift of the sensitivities of both sensor types deviates by approximately ±11%.

Figure 4B:
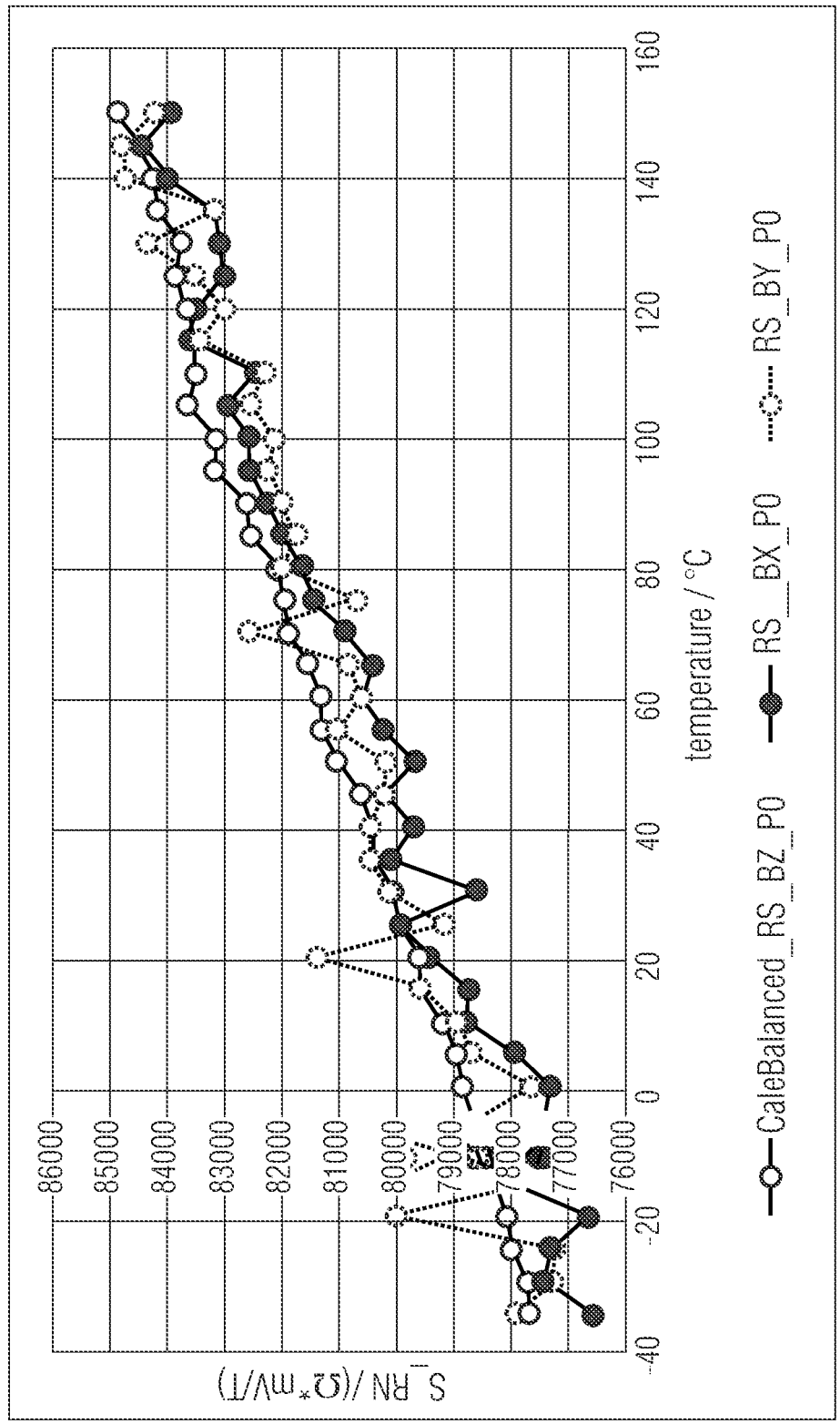
FIG. 4b shows an exemplary progression of the resistance-normalized sensitivity with a balancing of $B_Z$ to $B_X$ at 25° C. (symbol phase PH0) according to an embodiment.

By balancing with the help of the resistance-normalized sensitivity $S_{RN}$ of the Z sensor with respect to that of the X sensor $S_{RN}$, synchronism of the sensitivity drift of both Hall sensor elements is achieved, as is illustrated in FIG. 4b. FIG. 4b shows an exemplarily progression of the resistance-normalized sensitivity with a balancing $B_Z$ to $B_X$ at 25° C. (single phase PH0). As can further be seen in FIG. 4b, the progressions of the resistance-normalized sensitivity essentially have the same slope so that the resistance-normalized sensitivities vary across the temperature "to the same extent", i.e. they are in synchronism.

Figure 4C:
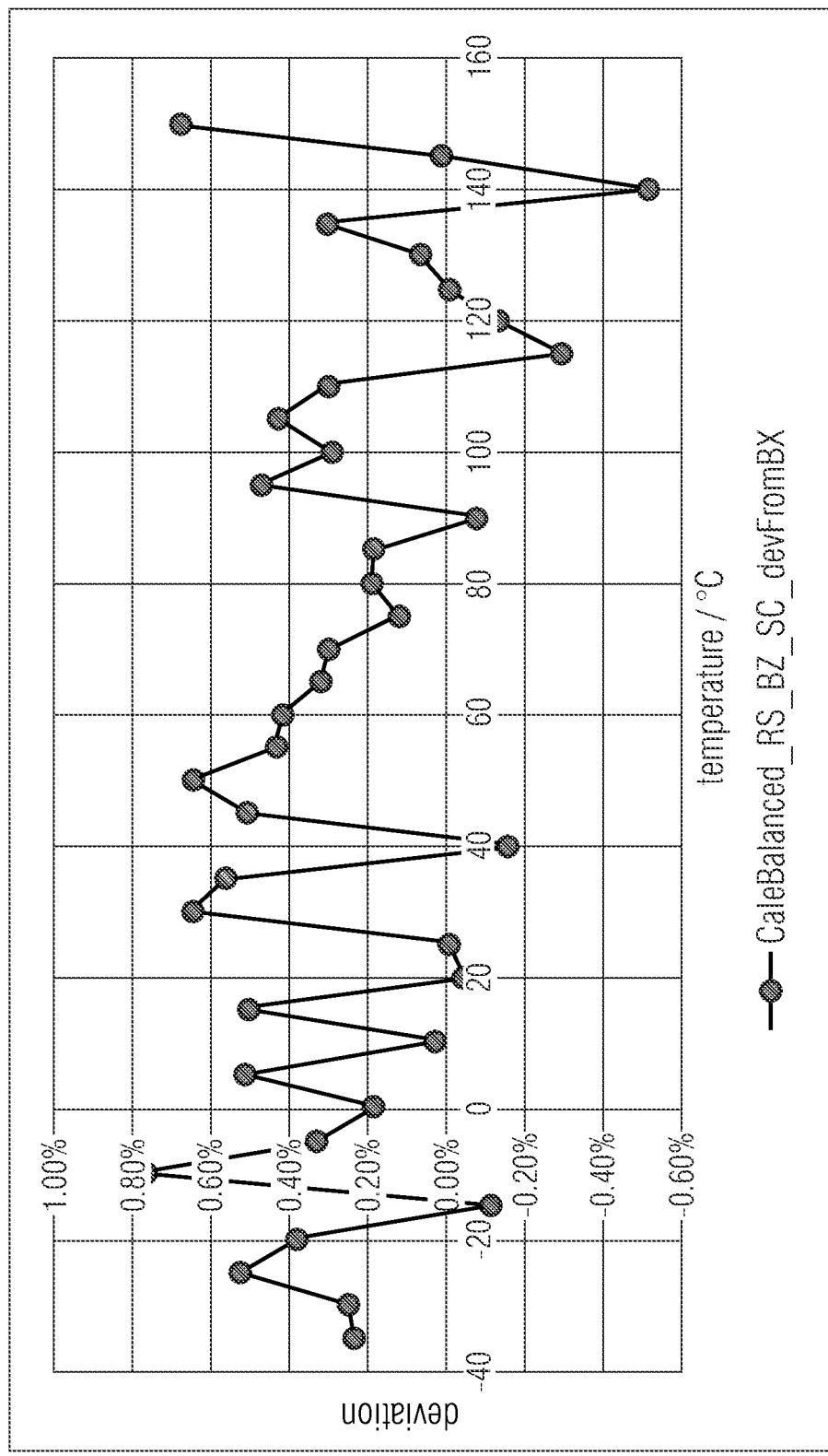
FIG. 4c shows an exemplary progression of the deviation of the resistance-normalized sensitivity $B_Z$ compared to $B_X$ after a balancing of $B_Z$ to $B_X$ at 25° C. (spinning current) according to an embodiment.

When looking at the deviation of the drift of the resistance-normalized sensitivity of the Z sensor compared to the drift of the resistance-normalized sensitivity of the X sensor, it is less than 1%, as can be seen in FIG. 4c. FIG. 4c shows an exemplarily progression of a deviation of the resistance-normalized sensitivity $B_Z$ to $B_X$ after a balancing of $B_Z$ to $B_X$ at 25° C. (spinning current). Thus, for a ratiometric measurement system, a combination of lateral and vertical Hall sensors may be used, simplifying the setup of such a system.

According to the above-described embodiments of the present concept 100 for determining sensitivity $S_{Hall}$ of a Hall sensor element 20, e.g. on the basis of the above-mentioned constraints such as the manufacturing technology, sensor setup, semi-conductor material, etc., the temperature dependence of the sensitivity of the Hall sensor element may be proportional to the charge carrier mobility, while the temperature dependence of the resistance of the Hall sensor element may be indirectly proportional to the charge carrier mobility.

The method 100 for determining an instantaneous sensitivity of a Hall sensor element 20 that is illustrated on the basis of FIG. 1 will now be exemplarily described with the electrical conductivity value $L_{Hall}=1/R_{Hall}$ as the operational quantity X of the Hall sensor element 20.

In the optional further step 170, according to a further embodiment, the (instantaneous) sensitivity of the Hall sensor element is determined on the basis of the reference sensitivity $S_0$ and the "quotient" (=an example for the interdependency) between the electrical reference conductivity value $L_0$ and the identified instantaneous electrical conductivity value $1/R_1$ of the Hall sensor element 20.

The method 100 may therefore further comprise a step 180 of determining a sensitivity-conductivity quotient (=conductivity-normalized sensitivity) $S_{RN}$ of the respective Hall sensor element as a quotient (ratio) of the reference sensitivity $S_0$ and the electrical reference conductivity value $L_0$ of the respective Hall sensor element, according to the following relationship (equation 9):

$$S_{RN}=S_0/L_0 (=\text{conductivity-normalized sensitivity})$$

The method 100 may therefore further comprise a step of determining 190 the (instantaneous) sensitivity $S_{Hall}$ of the respective Hall sensor element on the basis of the following relationship (equation 10):

$$S_{Hall}=L_1/L_0*S_0=S_{IN}*L_1, (=\text{instantaneous Hall sensitivity})$$

with $L_0$=electrical reference conductivity value
$L_1$=instantaneous electrical conductivity value ($L_{Hall}=1/R_{Hall}$)
$S_{LN}$=sensitivity-conductivity quotient
of the respective Hall sensor element 20.

The above embodiments of the method 100 now have in common that the instantaneous sensitivity $S_{Hall}$ of the Hall sensor element 20, i.e. the (temperature-dependent) deviation of the instantaneous sensitivity $S_{Hall}$ compared to the reference sensitivity value, may be determined on the basis of the applied drive signal $S_{IN}$ of the Hall sensor element 20, which makes it possible to perform the sensitivity determination of the Hall sensor element 20 independently of calibration magnetic fields, etc. in an extremely efficient and quick way.

A further method 200 for determining an instantaneous sensitivity $S_{Hall}$ of a Hall sensor element 20 is now exemplarily described on the basis of FIG. 5. FIG. 5 shows a schematic flow diagram of the method 200 for determining the instantaneous sensitivity $S_{Hall}$ of the Hall sensor element 20 according to the further embodiment.

According to the further embodiment of the inventive concept, the known, identified or specified interdependency between the temperature-dependent sensitivity $S_{Hall}$ and the temperature-dependent electrical resistance $R_{Hall}$ (or the operational quantity X derived therefrom) of the Hall sensor element 20 may be "modeled" mathematically, i.e. the relationship between the temperature-related variation of the sensitivity $S_{Hall}$ and the temperature-related variation of the operational quantity X of the Hall element 20 dependent on or derived from the electrical resistance value $R_{Hall}$ (=sensitivity-operational quantity relationship) may be reproduced mathematically with the temperature as a variable.

A further method 200 for determining an instantaneous sensitivity $S_{Hall}$ of a Hall sensor element 20 is now exemplarily described on the basis of FIG. 5. FIG. 5 shows a schematic flow diagram of the method 200 for determining the instantaneous sensitivity $S_{Hall}$ of the Hall sensor element 20 according to the further embodiment.

According to the further embodiment of the inventive concept, the known, identified or specified interdependency between the temperature-dependent sensitivity $S_{Hall}$ and the temperature-dependent electrical resistance $R_{Hall}$ (or the operational quantity X derived therefrom) of the Hall sensor element 20 may now be "modeled" mathematically, i.e. the temperature-dependent sensitivity $S_{Hall}$ may now be reproduced as a (mathematical) model or function F(X,T) with the temperature-dependent operational quantity X derived from or dependent on the electrical resistance value $R_{Hall}$ of the Hall element 20, with the temperature as a variable.

According to an embodiment, the method 200 for determining a (instantaneous) sensitivity $S_{Hall}$ of a Hall sensor element 20 of a Hall sensor 10 includes a step of providing 210 a model F(X,T) (=a mathematical function) for the sensitivity $S_{Hall}$ with the operational quantity X of the Hall sensor element 20 and with the temperature T of the Hall sensor element 20 as a variable. In this case, the operational quantity X depends on or is derived from the electrical resistance value $R_{Hall}$ of the sensor element 20.

For example, this may be done on the basis of the measurement values of the electrical operational quantity X and the sensitivity $S_{Hall}$ at different temperatures T. With respect to the definition of the operational quantity X, reference is again made to the explanations in the context of the above description of the method 100, which may also be applied accordingly in the following.

In step 220, an instantaneous value $X_1$ of the operational quantity X of the Hall sensor element 20 is determined on the basis of a drive signal $S_{IN}$ of the Hall sensor element 20, wherein, in step 230, the instantaneous temperature $T_1$ of the active area of the Hall sensor element 20 is determined.

In step 240, the instantaneous sensitivity $S_{Hall}$ of the Hall sensor element 20 is determined (e.g. as an absolute value) on the basis of the value (e.g. the function value) of the model that is associated with the instantaneous temperature value $T_1$ and the instantaneous value $X_1$ of the operational quantity X, i.e. the function value of $F(X_1,T_1)$.

Thus, according to the present concept, a model or a function F(X,T) for the sensitivity with the operational quantity X of the Hall sensor element 20 and with the temperature T as a variable may be provided to begin with. For example, this may be done by identifying, i.e. retrieving, providing or measuring, a sensitivity value $S_N$ and a value $X_N$ of the operational quantity X of the Hall sensor element 20 at a plurality of temperature values $T_N$ each. This corresponds to a calibration at the temperature values $T_1, T_2, \ldots$, wherein the mathematical model F(X,T) for the sensitivity is then identified on the basis of the measurement values of the operational quantity and the sensitivity at the different temperatures.

Alternatively, it is also possible to set the model F(X,T) in a purely mathematical way if there is a "model" of the Hall sensor element 20 based on the manufacturing technology used, the respective setup, and the semiconductor material used for the sensor element, etc.

According to the present concept, the instantaneous value $X_1$ of the operational quantity X of the Hall sensor element 20 is determined on the basis of the applied drive signal (current and/or voltage application) $S_{IN}$ of the Hall sensor element 20, wherein the instantaneous temperature $T_1$ of the active area of the Hall sensor element 20 is further determined. The instantaneous sensitivity $S_{Hall}$ of the Hall sensor element (e.g. as an absolute value) may then be determined on the basis of the value for the function F(X,T) that is associated with the instantaneous temperature value $T_1$ and the instantaneous value $X_1$ of the operational quantity X.

According to an embodiment, step 210 of providing may further comprise a step 250 of identifying a sensitivity value $S_N$ of a value $X_N$ of the operational quantity X of the Hall sensor element 20 at a plurality of temperature values $T_N$ each, and may further comprise a step 260 of identifying the model F(X,T) for the sensitivity $S_{Hall}$ with the electrical operational quantity X of the Hall sensor element 20 and with the temperature T of the Hall sensor element 20 as a variable.

For example, this may be done by identifying, i.e. retrieving or providing by a memory 40 accessible for the processing means 30, or measuring, a sensitivity value $S_N$ and a value $X_N$ of the electrical operational quantity X of the Hall sensor element at a plurality of temperature values $T_N$ each. For example, this corresponds to a calibration at the temperature values $T_1, T_2, \ldots$, wherein the mathematical model F(X,T) for the sensitivity with the electrical operational quantity X of the Hall sensor element and the temperature T as a variable is then identified (on the basis of the measurement values of the operational quantity and the sensitivity at the different temperatures).

On the basis of a plurality of temperature points for the sensitivity $S_{Hall}$ (T), the typical functional $S_{Hall}$ (T)=F(X,T) may now be "fitted" (identified), e.g. by means of a measurement kit. For example, this typical function is also referred to as a "fitting function" (=mathematical model) of the sensitivity-operational quantity relationship.

In the context of the present description, "fitting" is understood to be a so-called "adjustment calculation" in the form of a mathematical optimization method so as to determine, or estimate, the parameters of a predetermined function (fitting function). Fitting, or a fit, is understood to be a function adjustment, for example, wherein possible measurement errors or uncertainties of the measurement points may be considered as well. A possible method or approach of a fit is the method of least squares, e.g., assuming a Gaussian-distributed measurement uncertainty. Obviously, other approaches and algorithms may be used to determine the fitting function, as long as the progression of the sensor output signal or a quantity derived therefrom are reproduced in a sufficiently precise way with the fitting function.

According to an embodiment, the plurality of temperature values $T_N$ may be selected so as to obtain an over-determined mathematical model or F(X,T). This determines the number of temperature points required to determine the model parameters. Assuming an over-determined system, for example, two temperature points are required in case of a linear relationship, three temperature points are required in case of a square relationship, etc. According to an embodiment, the model F(X,T) may comprise a linear function, a polynomial of the n-th order, a Taylor series, or an exponential function, or any other mathematical relationship.

According to an embodiment, the operational current $S_{IN}$ passing through the Hall sensor element may be decoupled by means of a current mirror circuit 60 here as well so as to determine the electrical resistance value $R_1$. According to an embodiment, the Hall sensor element 20 may be part of an absolute value-based Hall sensor or measurement system 10, e.g. a magnetic field probe, a current sensor, etc.

A further method 300 for determining an instantaneous sensitivity $S_{Hall}$ of a Hall sensor element 20 is now exemplarily described on the basis of FIG. 6. FIG. 6 shows a schematic flow diagram of the method 300 for determining the instantaneous sensitivity $S_{Hall}$ of the Hall sensor element 20 according to the further embodiment.

According to the further embodiment of the inventive concept, the known, identified, or specified interdependency between the temperature-dependent sensitivity $S_{Hall}$ and the temperature-dependent electrical resistance $R_{Hall}$ (or the operational quantity X derived therefrom) of the Hall sensor element 20 may be "modeled" mathematically, i.e. the relationship between the temperature-related variation of the sensitivity $S_{Hall}$ and the temperature-related variation of the operational quantity X of the Hall element 20 dependent on or derived from the electrical resistance value $R_{Hall}$ (=sensitivity-operational quantity relationship) may be reproduced mathematically with the temperature as a variable.

According to an embodiment, the method 300 for determining a (instantaneous) sensitivity $S_{Hall}$ of a Hall sensor element 20 of a Hall sensor 10 includes a step of providing 310 a model $f_{SXN}(T)$ (=a mathematical function) for a sensitivity-operational quantity relationship (=operational quantity-normalized sensitivity) of a sensitivity $S_{Hall}$ and an operational quantity X of the Hall sensor element with the temperature T as a variable, wherein the operational quantity X is dependent on or derived from the electrical resistance value $R_{Hall}$ of the sensor element 20. For example, this may be done on the basis of the measurement values of the electrical operational quantity X and the sensitivity $S_{Hall}$ at the different temperatures.

With respect to the definition of the operational quantity X, reference is again made to the explanations in the context of the above description of the method 100, which may be applied accordingly in the following.

In step 320, an instantaneous value $X_1$ of the operational quantity X of the Hall sensor element 20 is determined on the basis of a (applied) drive signal $S_{IN}$ of the Hall sensor element 20, wherein, at step 330, the instantaneous temperature $T_1$ of the active area of the Hall sensor element 20 is determined.

In step 340, the instantaneous sensitivity $S_{Hall}$ of the Hall sensor element 20 is determined (as an absolute value) on the basis of the value for the sensitivity-operational quantity relationship $f_{SXN}(T)$ that is associated with the instantaneous temperature value $T_1$, and the instantaneous value $X_1$ of the operational quantity X.

According to the present concept, a temperature-dependent model $f_{SXN}(T)$ for the sensitivity-operational quantity relationship (=operational quantity-normalized sensitivity) of a sensitivity and an operational quantity of the Hall sensor element with the temperature T as a variable may be provided to begin with. For example, this may be done by identifying i.e. deriving, providing, or measuring, a sensitivity value $S_N$ and a value $X_N$ of the operational quantity X of the Hall sensor element 20 at a plurality of temperature values $T_N$ each. This corresponds to a calibration at the temperature values $T_1, T_2, \ldots$, wherein the mathematical model $f_{SXN}(T)$ for the sensitivity-operational quantity relationship of a sensitivity and an electrical resistance of the Hall sensor element with the temperature T as a variable is then identified (on the basis of the measurement values of the operational quantity and the sensitivity at the different temperatures).

Alternatively, it is also possible to set the model $f_{SXN}(T)$ in a purely mathematical way if there is a "model" of the Hall sensor element 20 based on the manufacturing technology used, the respective setup, and the semi-conductor materials used for the sensor element, etc.

According to the present concept, the instantaneous value $X_1$ of the operational quantity X of the Hall sensor element 20 is now determined on the basis of the applied drive signal (current and/or voltage application) $S_{IN}$ of the Hall sensor element 20, wherein the instantaneous temperature $T_1$ of the active area of the Hall sensor element 20 is further determined. The instantaneous sensitivity $S_{Hall}$ of the Hall sensor element may ultimately be determined (as an absolute value) on the basis of the value for the sensitivity-operational quantity relationship $f_{SRN}(T)$ that is associated with the instantaneous temperature value $T_1$, and the instantaneous value $X_1$ of the operational quantity X.

According to an embodiment, the step 310 of providing may further comprise a step 350 of identifying a sensitivity value $S_N$ of a value $X_N$ of the operational quantity X of the Hall sensor element 20 at a plurality of temperature values $T_N$ each, and may further comprise a step 360 of identifying the model $f_{SXN}(T)$ for the sensitivity-operational quantity relationship of a sensitivity $S_{Hall}$ and an electrical operational quantity X of the Hall sensor element 20 with the temperature T as a variable.

For example, this may be done by identifying, i.e. retrieving from or providing by a memory 40 accessible for the processing means 30, or measuring, a sensitivity value $S_N$ and a value $X_N$ of the electrical operational quantity X of the Hall sensor element and a plurality of temperature values $T_N$ each. This corresponds to a calibration temperature value $T_1, T_2, \ldots$, wherein the mathematical model $f_{SXN}(T)$ for the sensitivity-operational quantity relationship of a sensitivity and an electrical operational quantity X of the Hall sensor element with the temperature T as variable is then identified (on the basis of the measurement values of the operational quantity and the sensitivity at the different temperatures).

On the basis of a plurality of temperature points for the sensitivity-operational quantity relationship, a typical functional may now be "fitted" (identified), e.g. by means of a measurement kit. For example, this typical function is also referred to as a "fitting function" (=mathematical model) of the sensitivity-operational quantity relationship.

In the context of the present description, "fitting" is understood to be a so-called "adjustment calculation" in the form of a mathematical optimization method so as to determine, or estimate, the parameters of a predetermined function (fitting function). Fitting, or a fit, is understood to be a function adjustment, for example, wherein possible measurement errors or uncertainties of the measurement points may be considered as well. A possible method or approach of a fit is the method of least squares, e.g., assuming a Gaussian-distributed measurement uncertainty. Obviously, other approaches and algorithms may be used to determine the fitting function, as long as the progression of the sensor output signal or a quantity derived therefrom are reproduced in a sufficiently precise way with the fitting function.

According to an embodiment, the sensitivity-operational quantity relationship is a product of the temperature-dependent sensitivity (S(T)) and the temperature-dependent electrical operational quantity (X(T)) of the Hall sensor element (20), wherein the method 300 further comprises a step 370 of determining the instantaneous sensitivity $S_{Hall}$ of the Hall sensor element 20 at the temperature value T on the basis of the following relationship or ratio (equation 11):

$$S(T)=f_{SXN}(T)/X(T), (=\text{instantaneous Hall sensitivity})$$

with X(T)=value of the electrical operational quantity at the temperature value T $f_{SXN}(T)$=function value of the operational quantity-sensitivity product at the temperature value T of the Hall sensor element 20.

According to a further embodiment, the sensitivity-operational quantity relationship is a quotient (=sensitivity-operational quantity quotient) of the temperature-dependent sensitivity S(T) and the temperature-dependent electrical operational quantity X(T) of the Hall sensor element 20, wherein the method 300 further comprises a step 380 of determining the (instantaneous) sensitivity S(T) of the Hall sensor element at the temperature value T on the basis of the following relationship (equation 12):

$$S(T)=f_{SXN}(T)*X(T), (=\text{instantaneous Hall sensitivity})$$

with X(T)=value of the operational quantity at the temperature value T $f_{SXN}(T)$=functional value of the sensitivity-operational quantity product at the temperature value T of the Hall sensor element 20.

According to an embodiment, the plurality of temperature values $T_N$ may be selected so as to obtain an over-determined mathematical model $f_{SRN}(T)$. This determines the number of temperature points required to determine the model parameters. Assuming an over-determined system, for example, two temperature points are required in case of a linear relationship, three temperature points are required in case of a square relationship, etc.

According to an embodiment, the model $f_{SRN}(T)$ may comprise a linear function, a polynomial of the n-th order, a Taylor series, or an exponential function, or any other mathematical relationship.

According to an embodiment, the operational current $S_{IN}$ passing through the Hall sensor element may be decoupled by means of a current mirror circuit 60 here as well so as to determine the electrical resistance value $R_1$, for example.

According to an embodiment, the Hall sensor element 20 may be part of an absolute value-based Hall sensor or measurement system 10, e.g. a magnetic field probe, a current sensor, etc.

The method 300 for determining an instantaneous sensitivity of a Hall sensor element 20 illustrated on the basis of FIG. 6 is now exemplarily described with the electrical resistance value $R_{Hall}$ (internal resistance or Hall resistance) as the operational quantity X of the Hall sensor element 20.

According to further embodiments of the inventive concept, the known, identified or specified interdependency between the temperature-dependent sensitivity $S_{Hall}$ and the temperature-dependent electrical resistance $R_{Hall}$ of the Hall sensor element 20 may be "modeled" mathematically, i.e. the relationship between the temperature-related variation of the sensitivity $S_{Hall}$ and temperature-related variation of the electrical resistance $R_{Hall}$ of the Hall element 20 (=sensitivity-resistance relationship) may be reproduced mathematically with the temperature as a variable.

For further explanation, reference is again made to FIGS. 2a-b, wherein FIG. 2a illustrates a schematic diagram of a magnetic field sensor element (Hall sensor element) according to an embodiment, and FIG. 2b illustrates a schematic top view of a magnetic field sensor (Hall sensor) according to an embodiment, wherein the magnetic field sensor comprises at least one Hall sensor element. As is exemplarily illustrated in FIG. 2b, the Hall sensor 10 comprises at least one Hall sensor element 20 and a processing means 30 configured for performing the method 300.

According to the embodiment, the method 300 for determining a (instantaneous) sensitivity $S_{Hall}$ of a Hall sensor element 20 (a Hall sensor 10) includes a step of providing 310 a model $f_{SRN}(T)$ (=a mathematical function) for a sensitivity-resistance relationship (=resistance-normalized sensitivity) of a sensitivity $S_{Hall}$ and an electrical resistance $R_{Hall}$ of the Hall sensor element with the temperature T as a variable. For example, this may be done on the basis of the measurement values of the electrical resistance value $R_{Hall}$ and the sensitivity $S_{Hall}$ at the different temperatures.

In step 320, the instantaneous electrical resistance value $R_1$ of the Hall sensor element 20 is now determined on the basis of a (applied) drive signal $S_{IN}$ of the Hall sensor element 20, wherein, in step 330, the instantaneous temperature $T_1$ of the active area of the Hall sensor element 20 is determined.

In step 340, the instantaneous sensitivity $S_{Hall}$ of the Hall sensor element 20 is determined (as an absolute value) on the basis of the value for the sensitivity-resistance relationship $f_{SRN}(T)$ that is associated with the instantaneous temperature value $T_1$, and the instantaneous electrical resistance value $R_1$.

According to the present concept, a temperature-dependent model $f_{SRN}(T)$ for the sensitivity-resistance relationship (=resistance-normalized sensitivity) of a sensitivity and an electrical resistance of the Hall sensor element with the temperature T as a variable may be provided to begin with. For example, this may be done by identifying, i.e. retrieving, providing or measuring, a sensitivity value $S_N$ and an electrical resistance value $R_N$ of the Hall sensor element at a plurality of temperature values $T_N$ each. This corresponds to a calibration at the temperature values $T_1, T_2, \ldots$, wherein the mathematical model $f_{SRN}(T)$ for the sensitivity-resistance relationship of a sensitivity and an electrical resistance of the Hall sensor element with the temperature T as a variable is then identified (on the basis of the measurement values of the electrical resistance value and the sensitivity at the different temperatures).

Alternatively, for example, it is also possible to create the model $f_{SRN}(T)$ in a purely mathematical way if there is a "model" of the Hall sensor element 20 based on the manufacturing technology used, the respective setup and the semiconductor material used for the sensor element, etc.

According to the present concept, the instantaneous electrical resistance value $R_1$ of the Hall sensor element 20 is now determined on the basis of an applied drive signal (current or voltage application) $S_{IN}$ of the Hall sensor element 20, wherein the instantaneous temperature $T_1$ of the active area of the Hall sensor element 20 is further determined. The instantaneous sensitivity $S_{Hall}$ of the Hall sensor element may ultimately be determined (as an absolute value) on the basis of the value for the sensitivity-resistance relationship $f_{SRN}(T)$ that is associated with the instantaneous temperature value $T_1$, and the instantaneous electrical resistance value $R_1$.

According to an embodiment, step 310 of providing may further comprise a step 350 of identifying a sensitivity value $S_N$ and an electrical resistance value $R_N$ of the Hall sensor element at a plurality of temperature values $T_N$ each, and may further comprise a step 360 of identifying the model $f_{SRN}(T)$ for the sensitivity-resistance relationship of a sensitivity and an electrical resistance of the Hall sensor element 20 with the temperature T as a variable.

For example, this may be done by identifying, i.e. retrieving from, providing by a memory 40 accessible for the processing means 30, or measuring, a sensitivity value $S_N$ and an electrical resistance value $R_N$ of the Hall sensor element at a plurality of temperature values $T_N$ each. This corresponds to a calibration at the temperature values $T_1$, $T_2$, ..., wherein the mathematical model $f_{SRN}(T)$ for the sensitivity-resistance relationship of a sensitivity and an electrical resistance of the Hall sensor element with the temperature T as a variable is then identified (on the basis of the measurement values of the electrical resistance value and the sensitivity and the different temperatures).

According to an embodiment, the sensitivity-resistance relationship is a product (=sensitivity-resistance product) of the temperature-dependent sensitivity S(T) and the temperature-dependent electrical resistance value R(T) of the Hall sensor element, wherein the method 300 further comprises a step 370 of determining the instantaneous sensitivity $S_{Hall}$ of the Hall sensor element 20 at the temperature value T on the basis of the following relationship or ratio (equation 13):

$$S(T)=f_{SRN}(T)/R(T), (=\text{instantaneous Hall sensitivity})$$

with R(T)=electrical resistance value at the temperature value T $f_{SRN}(T)$=functional value of the resistance-sensitivity product at the temperature value T of the Hall sensor element 20.

According to a further embodiment, the sensitivity-resistance relationship is a quotient (=sensitivity-resistance quotient) of the temperature-dependent sensitivity S(T) and the temperature-dependent electrical resistance value R(T) of the Hall sensor element, wherein the method 300 further comprises a step 380 of determining the (instantaneous) sensitivity S(T) of the Hall sensor element at the temperature value T on the basis of the following relationship (equation 14):

$$S(T)=f_{SRN}(T)*R(T), (=\text{instantaneous Hall sensitivity})$$

with R(T)=electrical resistance value at the temperature value T $f_{SRN}(T)$=functional value of the sensitivity-resistance quotient at the temperature value T of the Hall sensor element 20.

According to an embodiment, the plurality of temperature values $T_N$ may be selected so as to obtain an over-determined mathematical model $f_{SRN}(T)$. This determines the number of temperature points required so as to determine the model parameters. Assuming an over-determined system, for example, two temperature points are required in case of a linear relationship, three temperature points are required in case of a square relationship, etc.

According to an embodiment, the model $f_{SRN}(T)$ may comprise a linear function, a polynomial of the n-th order, a Taylor series, or an exponential function, or any other mathematical relationship.

According to an embodiment, the operational current $S_{IN}$ passing through the Hall sensor element may be decoupled by means of a current mirror circuit 60 here as well so as to determine the electrical resistance value $R_1$.

According to an embodiment, the Hall sensor element 20 may be part of an absolute value-based Hall sensor or measurement system 10, e.g. a magnetic field probe, a current sensor, etc.

According to a possible application scenario, the method 300 may be used to obtain an indirect magnetically-independent sensitivity measurement, e.g. for absolute value-based measurement systems.

In case of absolute value-based measurement systems 10, such as Hall effect current sensors, it is advantageous to know, or be able to determine, the sensitivity $S_{Hall}$ of the Hall sensor element 20 at each point in time as precisely as possible. Until now, this has presumed an elaborate calibration of the sensor systems 10 across their entire temperature range. In addition, reliable measurement of the sensitivities in the later system is not possible without knowing the precise magnetic surrounding conditions.

In the above embodiments (with respect to the ratiometric Hall sensors 10 and the associated method 100 for determining an instantaneous sensitivity of a Hall sensor element), it has been shown that there is an interdependency between the magnetic sensitivity $S_{Hall}$ and the operational quantity X, such as the electrical resistance $R_{Hall}$, of a Hall sensor element 20. This relationship can be used to simplify the calibration of the systems, or Hall sensors 10, and to indirectly measure the sensitivity $S_{Hall}$ of the Hall sensors 10, or their Hall sensor elements 20, in the later system via their operational quantity X, such as their (respective) electrical resistance $R_{Hall}$.

To this end, the interdependency between the sensitivity $S_{Hall}$ of a Hall sensor element 20 and its operational quantity X, such as its electrical resistance $R_{Hall}$, is modeled mathematically. The model (T) may be a linear function, a polynomial of the n-th order, an exponential function, or the like. Its parameters contain the base quantities, i.e. the sensor sensitivity $S_{Hall}$, the sensor operational quantity X, such as the sensor resistance $R_{Hall}$, as well as the temperature T. If an appropriate model has been developed, it determines the number of temperature points required to determine the model parameters (assuming an over-determined system, for example, two temperature points in case of linear relationship, three in case of square relationship, etc.).

After the calibration, the mathematical model (T) is stored with the measured parameters in the sensor system 10, e.g. in the memory 50. In order to be able to determine the sensitivity $S_{Hall}$ of a Hall sensor element 20 of the sensor system 10, the temperature T as well as the operational quantity X, such as the electrical resistance $R_{HALL}$, of the sensor element 20 are measured during operation. The calculation of the sensitivity is carried out according to this relationship (equation 15):

$$S_{Hall}(T) = \frac{f_{S_{RN}}(T)}{R_{Hall}(T)}$$

Thus, the determination of the sensor sensitivity is independent of magnetic influences.

Example: The interdependency between the sensitivity and the resistance of the Hall sensor in FIG. 3c is linear. Thus, the mathematical model results to (equation 16):

$$f_{S_{RN}}=m*T+t$$

with the slope m, the temperature T and the intercept t. The slope and the intercept are determined by calibration at two temperature points. In this case, the sensitivity in the sensor system is calculated according to (equation 17):

$$S_{Hall}(T) = \frac{m*T+t}{R_{Hall}(T)}$$

Figure 7:
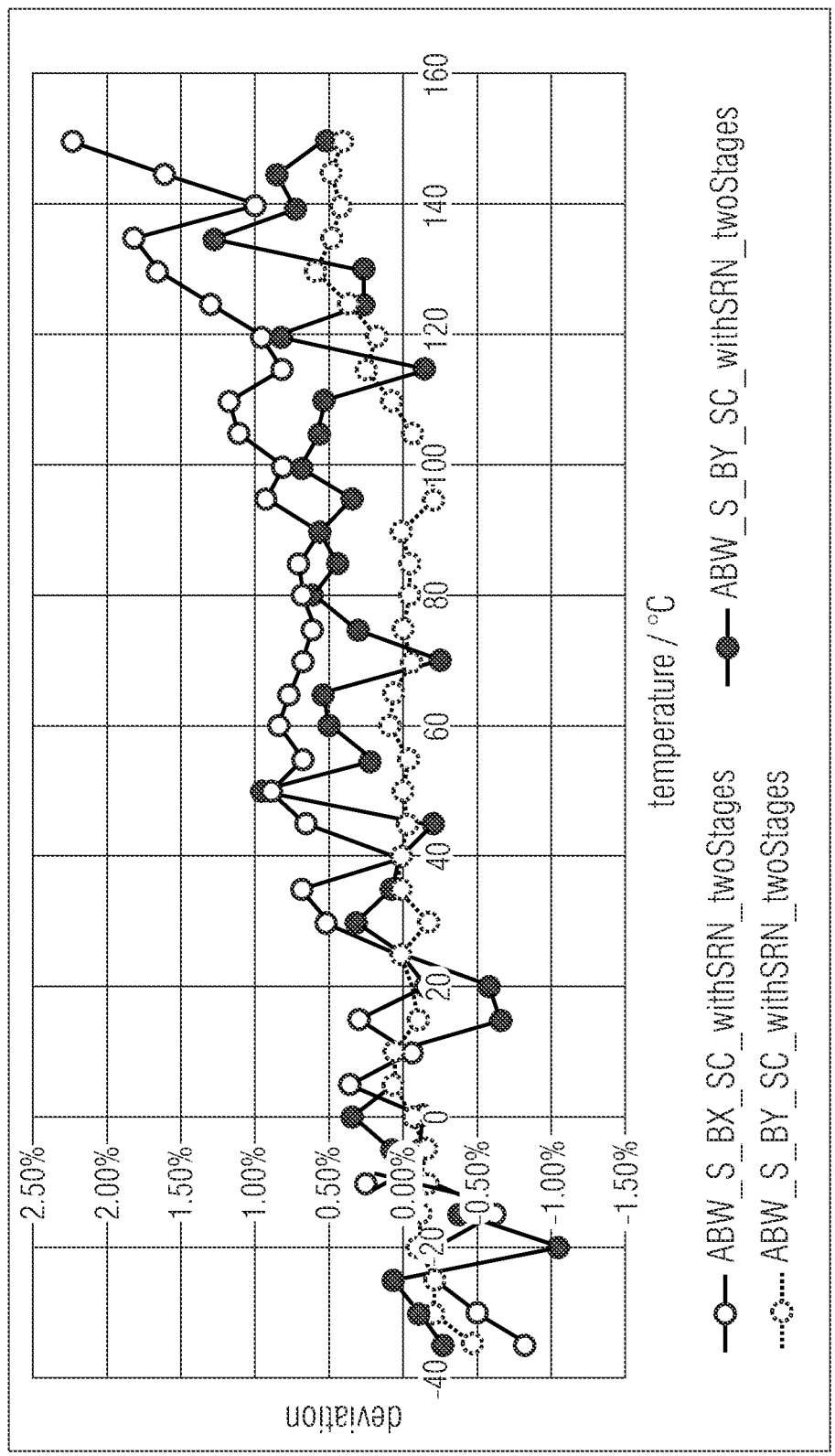
FIG. 7 shows an exemplary progression of the indirectly-measured Hall sensor sensitivity after a calibration at 25° C. and 40° C. compared to measurement values with Helmholtz coils according to an embodiment.

FIG. 7 shows the result after the calibration at 25° C. and 40° C. The sensitivity values at the remaining temperature points were calculated indirectly by means of the measurement of the resistance $R_{Hall}$ and the temperature T according to equation 17. FIG. 7 shows an exemplary progression of the deviation of the indirectly measured Hall sensor sensitivity after the calibration at 25° C. and 40° C. compared to measurement values with Helmholtz coils according to an embodiment.

Advantageous aspects of the inventive concept as defined by the method 100, 200 and 300 for determining a sensitivity ($S_{Hall}$) of a Hall sensor element are again illustrated in the following.

Through the above-described link of the sensitivity and the electrical resistance of a Hall sensor element, synchronism of lateral and vertical Hall sensor elements is created, or enabled in the first place. Thus, it is technically possible to realize sensor arrays, such as angular sensors, from a combination of lateral and vertical Hall sensor elements, wherein a calibration of the (temperature-dependent) sensitivity of such sensor arrays with different types of Hall sensor elements is made possible without external magnetic fields. Thus, magnetically-independent determination of the sensitivity of Hall sensors, or Hall sensor elements, may be technically realized with the methods 100, 200, 300 introduced herein.

Furthermore, the calibration effort may be simplified both for ratiometric and also absolute-based systems (Hall sensors) with high precision requirements.

The inventive concept according to the methods 100, 200 and 300 is generally applicable to Hall sensor measurement systems, i.e. to ratiometric sensor arrays, such as angular sensors, positional sensor systems, and also to absolute value-based sensor arrays, such as current sensors.

The sensitivity of the Hall sensor, or the Hall sensor element, may be measured indirectly by linking the electrical resistance and the sensitivity of a Hall sensor element. This enables sensitivity synchronism in 2D or 3D Hall sensors (e.g. ratiometric measurement systems) and indirect measurement of the sensitivity in Hall sensors in general (e.g. absolute value-based measurement systems).

Although some aspects have been described as features in the context of an apparatus it is clear that such a description may also be regarded as a description of corresponding features of a method. Although some aspects have been described as features in the context of a method, it is clear that such a description may also be regarded as a description of corresponding features concerning the functionality of an apparatus. Some or all of the method steps may be performed by a hardware apparatus (or using a hardware apparatus) such as a microprocessor, a programmable computer, or an electronic circuit. In some embodiments, some or several of the method steps may be executed by such an apparatus. Depending on certain implementation requirements, embodiments of the invention may be implemented in hardware or software, or may be at least partially implemented in hardware or software.

In the foregoing Detailed Description, various features are grouped together in examples for the purpose of streamlining the disclosure. This method of disclosure is not to be interpreted as reflecting an intention that the claimed examples comprise more features than are expressly recited in each claim. Rather, as the following claims reflect, subject matter may lie in less than all features of a single disclosed example. Thus the following claims are hereby incorporated into the Detailed Description, where each claim may stand on its own as a separate example. While each claim may stand on its own as a separate example, it is to be noted that, although dependent claims may refer in the claims to a specific combination with one or more other claims, other examples may also include a combination of dependent claims with the subject matter of each other dependent claim or a combination of each feature with other dependent or independent claims. Such combinations shall be included herein unless it is stated that a specific combination is not intended. Furthermore, it is intended to include also a combination of features of a claim with any other independent claim even if this claim is not directly made dependent to the independent claim.

Although specific embodiments have been illustrated and described herein, it will be appreciated by those of ordinary skill in the art that a multitude of alternate and/or equivalent implementations may be substituted for the specific embodiments shown and described without departing from the scope of the present embodiments. This application is intended to cover any adaptations or variations of the specific embodiments discussed herein. Therefore, it is intended that the embodiments be limited only by the claims and the equivalents thereof.

The invention claimed is:

1. A method for Hall sensor element calibration, comprising:
   determining an instantaneous sensitivity ($S_{Hall}$) of a Hall sensor element based on an own electrical resistance value ($RH_{Hall}=R_1$) of the Hall sensor element and an interdependency between a temperature dependence of the instantaneous sensitivity ($S_{Hall}$) and a temperature dependence of an own operational quantity (X) of the Hall sensor element dependent on the own electrical resistance value ($RH_{Hall}=R_1$) of the Hall sensor element, and wherein determining the instantaneous sensitivity ($S_{Hall}$) of the Hall sensor element further comprises:
      identifying a reference sensitivity ($S_0$) and an electrical reference value ($X_0$) of the own operational quantity (X) of the Hall sensor element during an operational state for capturing the electrical reference value,
      determining an instantaneous value ($X_1$) of the own operational quantity (X) of the Hall sensor element based on a drive signal ($S_{IN}$) of the Hall sensor element during an operational state for capturing the instantaneous value, and
      determining the instantaneous sensitivity ($S_{Hall}$) of the Hall sensor element based on the reference sensitivity ($S_0$) and a ratio between the electrical reference value ($X_0$) of the own operational quantity (X) and of the instantaneous value ($X_1$) of the own operational quantity (X) of the Hall sensor element, and
   calibrating the Hall sensor element based on the instantaneous sensitivity ($S_{Hall}$) of the Hall sensor element.

2. The method of claim 1, wherein the own operational quantity (X) dependent on the own electrical resistance value ($R_{Hall}$) of the Hall sensor element is:
   (a) the own electrical resistance value ($R_{Hall}$) of the Hall sensor element, or
   (b) an electrical conductivity value ($1/R_{Hall}$) of the Hall sensor element, or
   (c) in a voltage-controlled operation, a supply current of the Hall sensor element, or (d) in a current-controlled operation, a supply voltage of the Hall sensor element, or (e) in a free-running operation, the own electrical resistance value ($R_{Hall}$) or the electrical conductivity value ($1/R_{Hall}$) of the Hall sensor element based on the supply current and the supply voltage of the Hall sensor element.

3. The method of claim 1, wherein a variation of the ratio between the electrical reference value ($X_0$) of the own operational quantity (X) and the instantaneous value ($X_1$) of the own operational quantity (X) corresponds to a variation of the instantaneous sensitivity ($S_{Hall}$) of the Hall sensor element.

4. The method of claim 1, further comprising:
determining an operational quantity-sensitivity product ($S_{XN}$) of the Hall sensor element as a product of the reference sensitivity ($S_0$) and the electrical reference value ($X_0$) of the own operational quantity (X) of a respective Hall sensor element based on a set of relationships below:
$S_{XN}=S_0 * X_0$ (=operational quantity-normalized sensitivity $S_{Hall}$)
wherein the own operational quantity (X) dependent on the own electrical resistance value ($R_{Hall}=R_1$) of the Hall sensor element is:
the own electrical resistance value ($R_{Hall}$) of the Hall sensor element, in a current-controlled operation, a supply voltage of the Hall sensor element, or in a free-running operation, the own electrical resistance value ($R_{Hall}$) of the Hall sensor element based on a supply current and the supply voltage of the Hall sensor element.

5. The method of claim 4, further comprising:
determining the instantaneous sensitivity ($S_{Hall}$) of the Hall sensor element based on a set of relationships below:
$S_{Hall}=X_0/X_1 * S_0=S_{XN}/X_1$ (=instantaneous Hall sensitivity) with $X_0$=electrical reference value of the own operational quantity
$X_1$=instantaneous value of the own operational quantity
$S_{XN}$=operational quantity-sensitivity product of the respective Hall sensor element.

6. The method of claim 1, comprising:
determining the instantaneous sensitivity ($S_{Hall}$) of the Hall sensor element based on the reference sensitivity ($S_O$) and a quotient between the electrical reference value ($X_0$) of the own operational quantity (X) and the instantaneous value ($X_1$) of the Hall sensor element;
wherein the own operational quantity (X) dependent on the own electrical resistance value ($R_{Hall}=R_1$) of the Hall sensor element is:
an electrical conductivity value ($1/R_{Hall}$) of the Hall sensor element, in a voltage-controlled operation, a supply current of the Hall sensor element, or in a free-running operation, the electrical conductivity value ($1/R_{Hall}$) of the Hall sensor element based on the supply current and a supply voltage of the Hall sensor element.

7. The method of claim 1, further comprising:
determining a sensitivity-operational quantity quotient ($S_{XN}$) of a respective Hall sensor element as a quotient of the reference sensitivity ($S_0$) and the electrical reference value ($X_0$) of the own operational quantity (X) of a respective Hall sensor element based on a set of relationships:
$S_{XN}=S_0 * X_0$ (=operational quantity-normalized sensitivity $S_{Hall}$)
wherein the own operational quantity (X) dependent on the own electrical resistance value ($R_{Hall}=R_1$) of the Hall sensor element is:
an electrical conductivity value ($1/R_{Hall}$) of the Hall sensor element, or
in a current-controlled operation, a supply voltage of the Hall sensor element, or
in a free-running operation, the electrical conductivity value ($1/R_{Hall}$) of the Hall sensor element based on a supply current and the supply voltage of the Hall sensor element.

8. The method of claim 7, further comprising:
determining the instantaneous sensitivity ($S_{Hall}$) of the respective Hall sensor element based on a set of relationships below:
$S_{Hall}=X_1/X_0 * S_0=S_{XN} * X_1$ (=instantaneous Hall sensitivity) with $X_0$=electrical reference value of the own operational quantity
$X_1$=instantaneous value of the own operational quantity
$S_{XN}$=sensitivity-operational quantity quotient
of the respective Hall sensor element.

9. The method of claim 1, wherein an operational current ($S_{IN}$) applied into the Hall sensor element is decoupled by means of a current mirror circuit in order to determine the own electrical resistance value ($R_1$) of the Hall sensor element.

10. A method for determining a sensitivity of a Hall sensor, wherein the Hall sensor comprises a plurality of Hall sensor elements, comprising:
performing the method according to claim 1 for the plurality of Hall sensor elements for determining the respective sensitivity of the Hall sensor elements of the Hall sensor.

11. The method of claim 10, wherein a plurality of Hall sensor elements comprises at least one Hall sensor element of a first sensor type and a further Hall sensor element of a further sensor type.

12. The method of claim 11, wherein the Hall sensor element is a lateral Hall sensor element, and wherein the further Hall sensor element is a vertical Hall sensor element.

13. The method of claim 10, wherein the Hall sensor comprises a plurality of Hall sensor elements configured for two-dimensionally capturing a magnetic field (B) along two linearly independent position vectors or orthogonal position vectors.

14. The method of claim 10, wherein the Hall sensor comprise a multitude of Hall sensor elements configured for three-dimensionally capturing a magnetic field (B) along three linearly independent position vectors or orthogonal position vectors.

15. A Hall sensor, comprising:
the Hall sensor element; and
a processor configured for performing the method according to claim 1.

16. A Hall sensor according to claim 15, wherein the Hall sensor comprises a plurality of Hall sensor elements and is part of a ratiometric measurement system.

17. A method for Hall sensor element calibration, comprising:
determining an instantaneous sensitivity ($S_{Hall}$) of a Hall sensor element based on an own electrical resistance value ($R_{Hall}$) of the Hall sensor element itself, comprising:

providing a model ($F(X_1T)$) for the instantaneous sensitivity ($S_{Hall}$) of the Hall sensor element with an own operational quantity (X) of the Hall sensor element and a temperature (T) as a variable, wherein the own operational quantity (X) depends on the own electrical resistance value ($R_{Hall}$), determining an instantaneous value ($X_1$) of the own operational quantity (X) of the Hall sensor element based on a drive signal ($S_{IN}$) of the Hall sensor element, determining an instantaneous temperature ($T_1$) of the Hall sensor element, and determining an instantaneous sensitivity ($S_{Hall}$) of the Hall sensor element based on a value of the model that is associated with a instantaneous temperature value ($T_1$) and the instantaneous value ($X_1$) of the own operational quantity (X), and calibrating the Hall sensor element based on the instantaneous sensitivity ($S_{Hall}$) of the Hall sensor element.

18. The method of claim 17, wherein providing further comprises:

identifying a sensitivity value ($S_N$) and a value ($X_N$) of the own operational quantity (X) of the Hall sensor element at a plurality of temperature values ($T_N$) each, and identifying the model ($F(X_1T)$) for the instantaneous sensitivity ($S_{Hall}$) with the own operational quantity (X) of the Hall sensor element and the temperature (T) as a variable.

19. The method of claim 17, wherein a plurality of temperature values ($T_N$) is selected so as to acquire an over-determined mathematical model ($F(X_1T)$).

20. The method of claim 17, wherein an operational current (SIN) passing through the Hall sensor element is decoupled by means of a current mirror circuit in order to determine the own electrical resistance value ($R_{Hall}$).

21. The method of claim 17, wherein the Hall sensor element is part of an absolute value-based Hall sensor.

22. A method for Hall sensor element calibration, comprising:

determining an instantaneous sensitivity ($S_{Hall}$) of a Hall sensor element based on an own electrical resistance value ($R_{Hall}$) of the Hall sensor element, comprising:

providing a model ($f_{SXN}(T)$) for a sensitivity-operational quantity relationship of a sensitivity ($S_{Hall}$) and an own operational quantity (X) of the Hall sensor element with a temperature value (T) as a variable, wherein the own operational quantity (X) depends on the own electrical resistance value ($R_{Hall}$), determining an instantaneous value ($X_1$) of the own operational quantity (X) of the Hall sensor element based on a drive signal ($S_{IN}$) of the Hall sensor element, determining an instantaneous temperature ($T_1$) of the Hall sensor element, and determining an instantaneous sensitivity ($S_{Hall}$) of the Hall sensor element based on a value for the sensitivity-operational quantity relationship that is associated with an instantaneous temperature value ($T_1$), and the instantaneous value ($X_1$) of the own operational quantity (X), and calibrating the Hall sensor element based on the instantaneous sensitivity ($S_{Hall}$) of the Hall sensor element.

23. The method of claim 22, wherein providing further comprises:

identifying a sensitivity value ($S_N$) and a value ($X_N$) of the own operational quantity (X) of the Hall sensor element at a plurality of temperature values (T) each, and identifying the model ($f_{SXN}(T)$) for the sensitivity-operational quantity relationship of a sensitivity ($S_{Hall}$) and an electrical operational quantity (X) of the Hall sensor element with the temperature value (T) as a variable.

24. The method of claim 22, wherein the sensitivity-operational quantity relationship is a product of a temperature-dependent sensitivity (S(T)) and a temperature-dependent electrical operational quantity (X(T)) of the Hall sensor element, further comprising:

determining the temperature-dependent sensitivity (S(T)) of the Hall sensor element at the temperature value (T) based on a set of relationships below:

$S(T)=(f_{SXN}(T)/X(T)$, (=instantaneous Hall sensitivity)

with X(T)=value of the electrical operational quantity at the temperature value (T)

$f_{SXN}(T)$=function value of a operational quantity-sensitivity product at the temperature value (T) of the Hall sensor element.

25. The method of claim 22, wherein the sensitivity-operational quantity relationship is a quotient of a temperature-dependent sensitivity (S(T)) and a temperature-dependent value of operational quantity (X(T)) of the Hall sensor element, further comprising:

determining the temperature-dependent sensitivity (S(T)) of the Hall sensor element at the temperature value (T) based on a set of relationships below:

$S(T)=(f_{SXN}(T)/X(T)$, (=instantaneous Hall sensitivity)

with X(T)=value of the operational quantity at the temperature value T $f_{SXN}(T)$=functional value of the sensitivity-operational quantity quotient at the temperature value (T) of the Hall sensor element.

26. The method of claim 22, wherein a plurality of temperature values ($T_N$) is selected so as to acquire an over-determined mathematical model ($f_{SRN}(T)$).

27. The method of claim 22, wherein an operational current ($S_{IN}$) passing through the Hall sensor element is decoupled by means of a current mirror circuit in order to determine the own electrical resistance value ($R_{Hall}$).

28. The method of claim 22, wherein the Hall sensor element is part of an absolute value-based Hall sensor.

29. A Hall sensor, comprising:

the Hall sensor element: and a processor configured for performing the method according to claim 16 or 22.

* * * * *

UNITED STATES PATENT AND TRADEMARK OFFICE
CERTIFICATE OF CORRECTION

PATENT NO. : 12,025,681 B2
APPLICATION NO. : 17/470898
DATED : July 2, 2024
INVENTOR(S) : Dennis Krause et al.

Page 1 of 1

It is certified that error appears in the above-identified patent and that said Letters Patent is hereby corrected as shown below:

On the Title Page

(30) Foreign Application Priority Data:
Insert -- Sep. 25, 2020 (DE) 102020212114 --

In the Claims

In Claim 1, Column 30, Line 33:
Delete "($RH_{Hall} = R_1$)" and insert -- ($R_{Hall} = R_1$) --

In Claim 1, Column 30, Line 38:
Delete "($RH_{Hall} = R_1$)" and insert -- ($R_{Hall} = R_1$) --

Signed and Sealed this
Nineteenth Day of August, 2025

Coke Morgan Stewart
*Acting Director of the United States Patent and Trademark Office*